(12) United States Patent
Lin et al.

(10) Patent No.: US 9,543,900 B1
(45) Date of Patent: Jan. 10, 2017

(54) SWITCHABLE SUPPLY AND TUNABLE LOAD IMPEDANCE POWER AMPLIFIER

(71) Applicant: QUALCOMM Incorporated, San Diego, CA (US)

(72) Inventors: Saihua Lin, Santa Clara, CA (US); Jonghoon Choi, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/744,894

(22) Filed: Jun. 19, 2015

(51) Int. Cl.
| | |
|---|---|
| H04B 1/04 | (2006.01) |
| H01Q 11/12 | (2006.01) |
| H03F 1/02 | (2006.01) |
| H04W 4/00 | (2009.01) |
| H04W 52/38 | (2009.01) |
| H03F 3/21 | (2006.01) |
| H03F 3/19 | (2006.01) |
| H04W 84/12 | (2009.01) |
| H04W 88/06 | (2009.01) |

(52) U.S. Cl.
CPC .............. *H03F 1/0205* (2013.01); *H03F 3/19* (2013.01); *H03F 3/211* (2013.01); *H04W 4/008* (2013.01); *H04W 52/38* (2013.01); H03F 2200/294 (2013.01); H03F 2200/451 (2013.01); H03F 2203/21106 (2013.01); H04W 84/12 (2013.01); H04W 88/06 (2013.01)

(58) Field of Classification Search
CPC ..... H04B 1/0053; H04B 1/006; H04B 1/0067; H04B 1/0458; H04B 1/406; H04B 1/0483; H03F 1/0277
USPC ........................... 455/120, 125, 127.1, 127.4
See application file for complete search history.

(56) References Cited

U.S. PATENT DOCUMENTS

| | | | | |
|---|---|---|---|---|
| 7,157,966 B2 * | 1/2007 | Baree | .................... | H03F 1/0261 330/133 |
| 8,331,289 B1 * | 12/2012 | Lee | ........................ | H04B 1/006 370/328 |
| 8,824,991 B2 * | 9/2014 | Chang | ....................... | H03F 3/19 330/129 |

(Continued)

FOREIGN PATENT DOCUMENTS

| | | |
|---|---|---|
| EP | 2587676 A1 | 5/2013 |
| WO | WO-2010141774 A2 | 12/2010 |

(Continued)

OTHER PUBLICATIONS

International Search Report and Written Opinion—PCT/US2016/033360—ISA/EPO—Jul. 15, 2016.

*Primary Examiner* — Simon Nguyen
(74) *Attorney, Agent, or Firm* — Paradice and Li LLP

(57) ABSTRACT

A transceiver configured to transmit data in a plurality of operating modes including a Wi-Fi mode and two or more different Bluetooth power modes, the transceiver comprising: a first power amplifier configured to amplify Bluetooth signals; a second power amplifier configured to amplify Wi-Fi signals; an antenna coupled to the second power amplifier; and a tunable load circuit, coupled between the first amplifier and the second amplifier, configured to provide a different load impedance for each of the plurality of operating modes, the tunable load circuit consisting of: two impedance paths coupled in parallel between output terminals of the first and second amplifiers; and a number of shunt paths coupled between the tunable load circuit and ground potential.

26 Claims, 14 Drawing Sheets

(56) References Cited

U.S. PATENT DOCUMENTS

| | | | |
|---|---|---|---|
| 2006/0164163 A1* | 7/2006 | Apel | H03F 1/0277 330/151 |
| 2008/0137566 A1* | 6/2008 | Marholev | H04B 1/406 370/310 |
| 2008/0253345 A1* | 10/2008 | Sanguinetti | H01Q 1/2291 370/339 |
| 2010/0008338 A1* | 1/2010 | Tsfati | H04B 1/006 370/338 |
| 2010/0210299 A1* | 8/2010 | Gorbachov | H04B 1/406 455/552.1 |
| 2010/0291888 A1 | 11/2010 | Hadjichristos et al. | |
| 2010/0311339 A1* | 12/2010 | Chung | H04B 1/0053 455/41.3 |
| 2011/0269416 A1* | 11/2011 | Kadoi | H04B 1/0458 455/127.2 |
| 2014/0002188 A1 | 1/2014 | Chen et al. | |
| 2014/0184334 A1 | 7/2014 | Nobbe et al. | |
| 2015/0051750 A1 | 2/2015 | Kurs et al. | |
| 2015/0085709 A1 | 3/2015 | Lee et al. | |
| 2015/0111610 A1 | 4/2015 | Hwang et al. | |
| 2015/0171800 A1 | 6/2015 | Hadjichristos et al. | |
| 2015/0194942 A1* | 7/2015 | Anderson | H03F 3/213 330/295 |
| 2015/0333791 A1* | 11/2015 | Anderson | H04B 1/48 455/83 |
| 2016/0080012 A1* | 3/2016 | Sun | H04B 1/0475 455/114.2 |

FOREIGN PATENT DOCUMENTS

| | | |
|---|---|---|
| WO | WO-2014026159 A1 | 2/2014 |
| WO | WO-2014100513 A1 | 6/2014 |

* cited by examiner

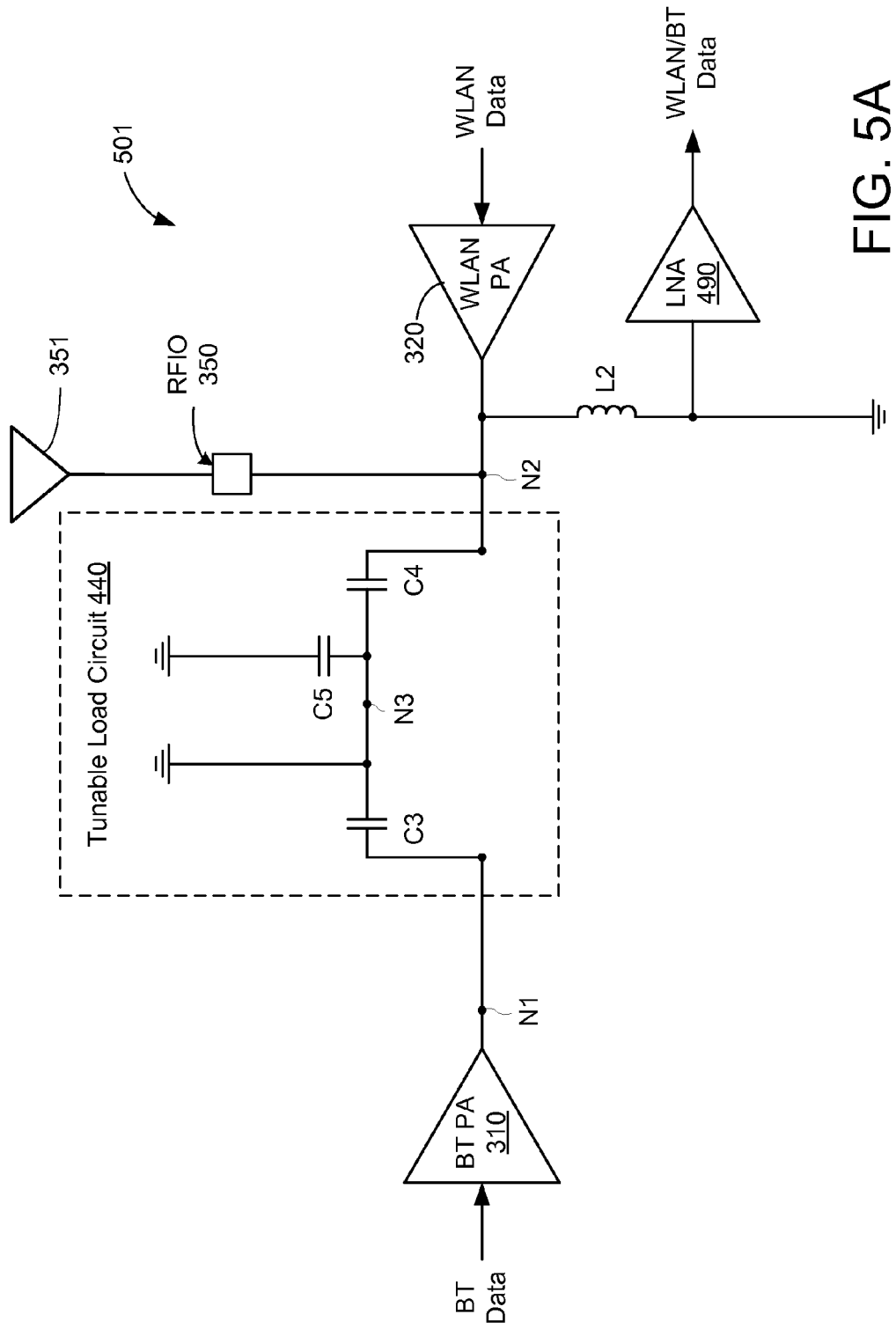

SWITCHABLE SUPPLY AND TUNABLE LOAD IMPEDANCE POWER AMPLIFIER

TECHNICAL FIELD

The present embodiments relate generally to wireless communications systems, and specifically to tunable load impedances for shared-antenna wireless communications systems.

BACKGROUND OF RELATED ART

Modern wireless communications devices typically include multiple wireless radios (e.g., Bluetooth®, Wi-Fi, etc.). To achieve a smaller footprint, multiple wireless radios may share the same antenna. For example, a wireless device may include a Bluetooth radio and a Wi-Fi radio coupled to a single antenna. The Bluetooth radio may include a Bluetooth power amplifier to drive (e.g., amplify) outgoing data signals in accordance with one or more Bluetooth standards. The Wi-Fi radio may include a Wi-Fi power amplifier to drive outgoing data signals in accordance with one or more IEEE 802.11 standards. The Bluetooth and Wi-Fi radios typically operate on the 2.4 GHz frequency band, and may share an antenna to transmit signals to other wireless devices and/or to receive signals from other wireless devices.

Power transmission efficiency may depend upon how closely matched the load impedance of a power amplifier is relative to the impedance that the power amplifier is able to efficiently drive. Bluetooth power amplifiers may be configured to operate in several different power modes (e.g., a high power mode, a low power mode, and an ultra-low power mode). Wi-Fi power amplifiers are typically operated at higher power levels than Bluetooth power amplifiers, for example, because Wi-Fi signals are typically transmitted at higher power levels than Bluetooth signals. As a result, Wi-Fi power amplifiers and Bluetooth power amplifiers may have different configurations, different operating characteristics, and/or different operating points, and may be optimized for power transmission efficiency by different load impedances.

For wireless devices including a Wi-Fi power amplifier and a Bluetooth power amplifier that share the same output load, it may be difficult to configure the output load in a manner that optimizes power transmission efficiency for both the Wi-Fi power amplifier and the Bluetooth power amplifier. Further, for wireless devices in which an antenna is shared between the Wi-Fi power amplifier and the Bluetooth power amplifier, it may be difficult to ensure reliability of the Bluetooth power amplifier when the Wi-Fi power amplifier is transmitting (e.g., because the Wi-Fi power amplifier typically drives Wi-Fi signals at higher power levels than the power levels to which the Bluetooth power amplifier drives Bluetooth signals).

Thus, there is a need to dynamically configure and/or dynamically adjust one or more settings of the shared output load in a manner that optimizes the power transmission efficiency for both the Wi-Fi power amplifier and the Bluetooth power amplifier and that ensures reliability of the Bluetooth power amplifier when the Wi-Fi power amplifier is transmitting.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Systems and methods are disclosed that may maximize power efficiency of both a Bluetooth power amplifier and a Wi-Fi power amplifier which share an antenna coupled to radio frequency input/output (RFIO) circuit. In accordance with example embodiments, an analog front-end (AFE) circuit for use in a transceiver of a wireless device is disclosed that includes at least a Bluetooth power amplifier, a Wi-Fi power amplifier, and a tunable load circuit. The tunable load circuit may be dynamically configured and/or adjusted to provide different load impedances for the Wi-Fi power amplifier and the Bluetooth power amplifier based on an operating mode of the AFE circuit. In addition, the AFE circuit may include a switchable power supply that may be dynamically configured to provide a number of different supply voltages to the Bluetooth power amplifier based on a Bluetooth power mode (e.g., Bluetooth high power mode, Bluetooth low power mode, and Bluetooth ultra-low power mode). The tunable load circuit may also prevent damage to the Bluetooth power amplifier when the AFE circuit is transmitting Wi-Fi signals from the antenna.

For the example embodiments described above, the tunable load circuit uses two impedance paths and two shunt paths to provide at least four different load impedances for different operating modes of the AFE circuit. In this manner, the tunable load circuit may consume less circuit area than conventional solutions that selectively couple a different set of capacitors to the Bluetooth power amplifier for each of the different Bluetooth power modes and selectively couple yet another set of capacitors to the Wi-Fi power amplifier for the Wi-Fi mode.

More specifically, for at least one example embodiment, the wireless device includes a transceiver configured to transmit data in a plurality of operating modes including a Wi-Fi mode and two or more different Bluetooth power modes, the transceiver comprising: a first power amplifier configured to amplify Bluetooth signals; a second power amplifier configured to amplify Wi-Fi signals; an antenna coupled to the second power amplifier; and a tunable load circuit, coupled between the first amplifier and the second amplifier, configured to provide a different load impedance for each of the plurality of operating modes, the tunable load circuit consisting of: two impedance paths coupled in parallel between output terminals of the first and second amplifiers; and a number of shunt paths coupled between the tunable load circuit and ground potential.

For some embodiments, the two or more different Bluetooth power modes may include a Bluetooth high power mode, a Bluetooth low power mode, and a Bluetooth ultra-low power mode. The tunable load circuit is configured to provide a first load impedance during the Bluetooth high power mode, to provide a second load impedance during the Bluetooth low power mode, and to provide a third load impedance during the Bluetooth ultra-low power mode, and is further configured to provide a fourth load impedance during the Wi-Fi mode. For at least one example embodiment, the first load impedance may be less than the second load impedance, the second load impedance may be less than the third load impedance, and the fourth load impedance may be a minimum, non-zero load impedance (e.g., a lowest possible load impedance value).

For some embodiments, the two impedance paths consist of: a first impedance path including a first capacitor, one or more first transistors, and a second capacitor coupled in series between the output terminals of the first and second amplifiers; and a second impedance path including a third capacitor and a fourth capacitor coupled in series between the output terminals of the first and second amplifiers. The number of shunt paths comprises: a first shunt path including a second transistor coupled between ground potential and a common node of the third and fourth capacitors; and a second shunt path including a third transistor and a fifth capacitor coupled in series between ground potential and the common node.

The transceiver may also include a low noise amplifier (LNA) including an input terminal coupled to the output terminal of the second amplifier; and a shunt transistor coupled between the input terminal of the LNA and ground potential, the shunt transistor including a gate to receive a transmission enable signal.

For another embodiment, the transceiver may be configured to transmit data in a plurality of operating modes, the transceiver comprising: a first amplifier configured to amplify first data signals; a second amplifier configured to amplify second data signals; an antenna coupled to the second amplifier; and a tunable load circuit, coupled between output terminals of the first and second amplifiers, configured to provide a different load impedance for each of the plurality of operating modes, the tunable load circuit comprising: a first impedance path including a first capacitor, one or more first transistors, and a second capacitor coupled in series between the output terminals of the first and second amplifiers; a second impedance path including a third capacitor and a fourth capacitor coupled in series between the output terminals of the first and second amplifiers; a first shunt path including a second transistor coupled between ground potential and a common node of the third and fourth capacitors; and a second shunt path including a third transistor and a fifth capacitor coupled in series between ground potential and the common node.

BRIEF DESCRIPTION OF THE DRAWINGS

The present embodiments are illustrated by way of example and are not intended to be limited by the figures of the accompanying drawings. Like numbers reference like elements throughout the drawings and specification.

FIG. 5A is a circuit diagram of the AFE circuit of FIG. 4A when configured for an example WLAN mode of operation.

DETAILED DESCRIPTION

Figure 1:
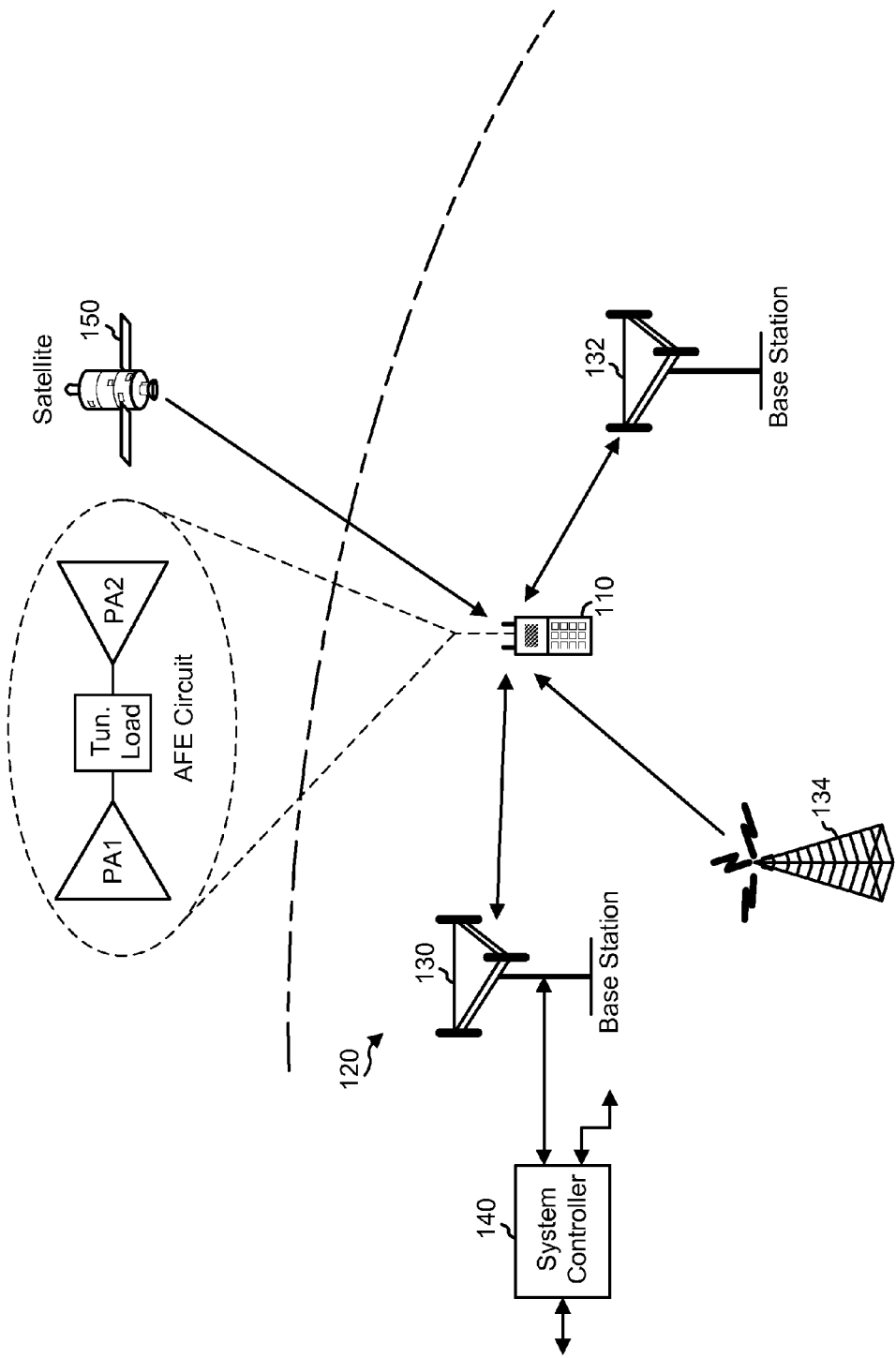
FIG. 1 is a diagram depicting a wireless device communicating with a wireless communication system, in accordance with example embodiments.

The example embodiments are described below in the context of WLAN and Bluetooth communications and networks for simplicity only. It is to be understood that the example embodiments are equally applicable to other types of communications and networks (e.g., cellular networks, pico networks, femto networks, satellite networks, etc.), as well as systems using signals of one or more wired standards or protocols (e.g., Ethernet and/or HomePlug/PLC standards). As used herein, the terms "WLAN" and "Wi-Fi®" may include communications governed by the IEEE 802.11 family of standards, HiperLAN (a set of wireless standards, comparable to the IEEE 802.11 standards, used primarily in Europe), and other technologies having relatively short radio propagation range. Further, as used herein, the term BLUETOOTH® (Bluetooth) may include communications governed by the Bluetooth Special Interest Group.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processes and other symbolic representations of operations on data bits within a computer memory. These descriptions and representations are the means used by those skilled in the data processing arts to most effectively convey the substance of their work to other skilled in the art.

The interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scopes all embodiments defined by the appended claims. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. Also, the example wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory computer-readable storage medium comprising instructions that, when executed, performs one or more of the methods described above. The non-transitory computer-readable data storage medium may form part of a computer program product, which may include packaging materials.

The non-transitory computer-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

FIG. 1 is a diagram depicting a wireless device 110 communicating with a wireless communication system 120, in accordance with example embodiments. The wireless communication system 120 may be an LTE system, a Code Division Multiple Access (CDMA) system, a Global System for Mobile Communications (GSM) system, a wireless local area network (WLAN) system (e.g., a Wi-Fi system), a Personal Area Network (PAN), or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows the wireless communication system 120 including two base stations 130 and 132 and one system controller 140. In general, a wireless system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with the wireless communication system 120. The wireless device 110 may also receive signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, WCDMA, CDMA 1x, EVDO, TD-SCDMA, GSM, Wi-Fi (e.g., IEEE 802.11 communications), Bluetooth communications, etc.

The wireless device 110 may include an AFE circuit that includes a tunable load circuit coupled between a first power amplifier (PA1) and a second power amplifier (PA2). As explained in more detail below, the tunable load circuit may provide a different load impedance for each of a plurality of operating modes of the wireless device 110. For at least some embodiments, the first power amplifier PA1 may be a Bluetooth power amplifier configured to amplify Bluetooth signals, and the second power amplifier (PA2) may be a WLAN power amplifier configured to amplify Wi-Fi signals.

Figure 2:
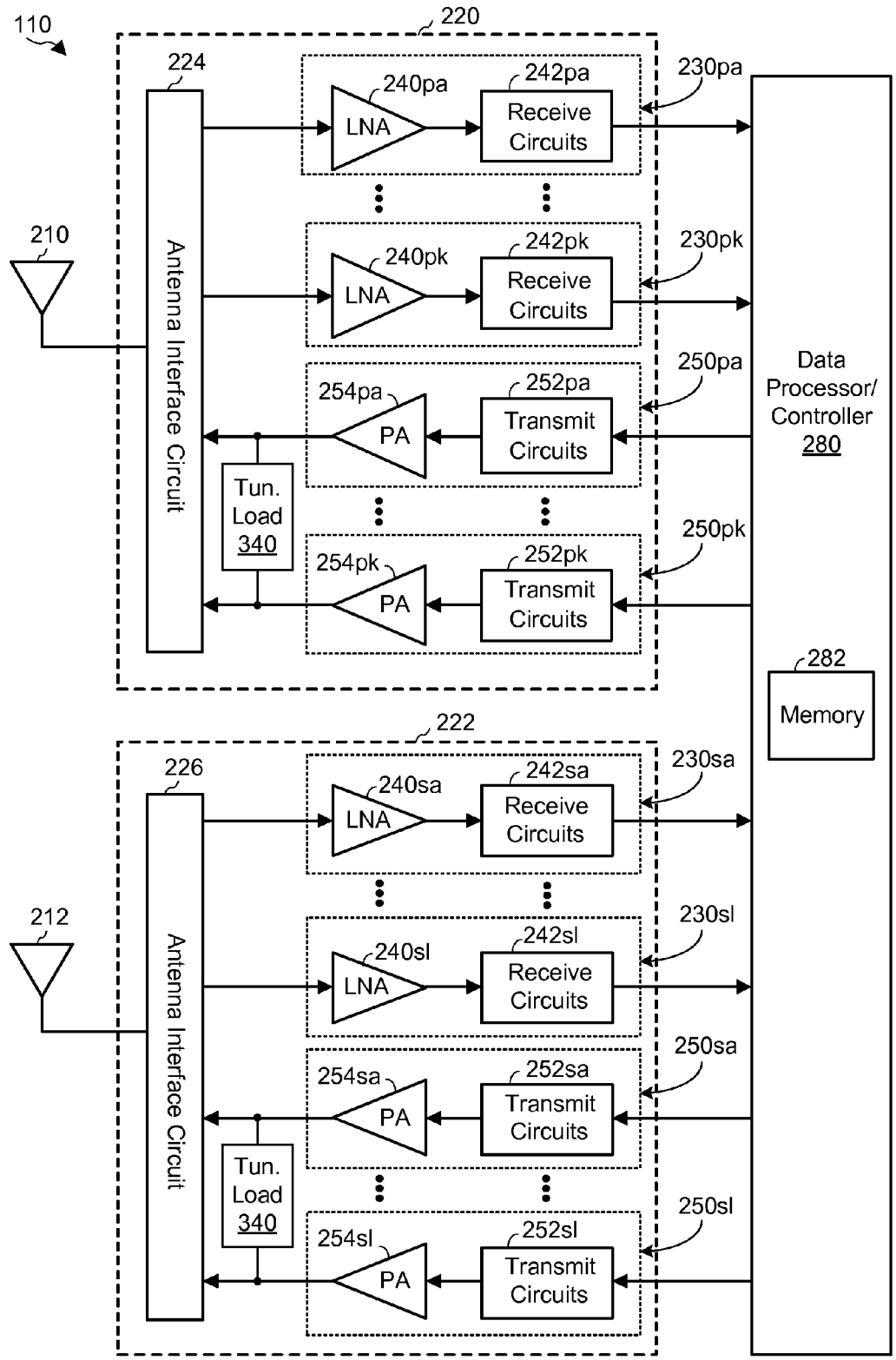
FIG. 2 is an example block diagram of the wireless device depicted in FIG. 1.

FIG. 2 shows a block diagram of one example embodiment of the wireless device 110 in FIG. 1. The wireless device 110 includes a primary transceiver 220 coupled to a primary antenna 210, a secondary transceiver 222 coupled to a secondary antenna 212, and a data processor/controller 280. The primary transceiver 220 includes a number (K) of receivers 230pa to 230pk and a number (K) of transmitters 250pa to 250pk to support multiple frequency bands, multiple radio technologies, carrier aggregation, etc. The secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

Each receiver 230 (e.g., 230pa-230pk and 230sa-230sl) includes a low noise amplifier (LNA) 240 (e.g., 240pa-240pk and 240sa-240sl) and a receive circuit 242 (e.g., 242pa-242pk and 242sa-242sl). For data reception, the primary antenna 210 receives signals from base stations and/or other transmitter stations and provides a received radio frequency (RF) signal, which is routed through an antenna interface circuit 224 and presented as an input RF signal to a selected receiver. The antenna interface circuit 224 may include switches, duplexers, transmit filters, receive filters, matching circuits, etc. The description below assumes that the receiver 230pa is the selected receiver. Within the receiver 230pa, an LNA 240pa amplifies the input RF signal and provides an output RF signal. The receive circuit 242pa may down-convert the output RF signal from RF to baseband, amplify and filter the down-converted signal, and provide an analog input signal to data processor/controller 280. The receive circuits 242pa may include mixers, filters, amplifiers, matching circuits, an oscillator, a local oscillator (LO) generator, a phase locked loop (PLL), etc. Each remaining receiver 230 in primary transceiver 220 may operate in similar manner as receiver 230pa. Receivers 230sa-230sl and associated antenna interface circuit 226 within secondary transceiver 222 may operate in a similar manner as receiver 230pa.

For the example of FIG. 2, each transmitter 250 (e.g., 250pa-250pk and 250sa-250sl) includes transmit circuits 252 (e.g., 252pa-252pk and 252sa-252sl) and power amplifiers (PA) 254 (e.g., 254pa-254pk and 254sa-254sl). For data transmission, the data processor/controller 280 processes (e.g., encodes and modulates) data to be transmitted and provides an analog output signal to a selected transmitter. The description below assumes that transmitter 250pa is the selected transmitter. Within the transmitter 250pa, the transmit circuit 252pa may amplify, filter, and up-convert the analog output signal from baseband to RF and provide a modulated RF signal. The transmit circuit 252pa may include amplifiers, filters, mixers, matching circuits, an oscillator, an LO generator, a PLL, and other suitable circuits, components, or modules. A PA 254pa receives and amplifies the modulated RF signal and provides a transmit RF signal having the proper output power level. The transmit RF signal is routed through antenna interface circuits 224 and transmitted via primary antenna 210. Each remaining transmitter 250 in the transceivers 220 and 222 may operate in similar manner as the transmitter 250pa.

Each receiver 230 and transmitter 250 may also include other circuits not shown in FIG. 2, such as filters, matching circuits, and other suitable circuits, components, or modules. All or a portion of the transceivers 220 and 222 may be implemented on one or more analog integrated circuits (ICs), RF ICs (RFICs), mixed-signal ICs, and other suitable circuits or devices. For example, the LNAs 240 and the receive circuits 242 within the transceivers 220 and 222 may be implemented on multiple IC chips. The circuits in the transceivers 220 and 222 may also be implemented in other manners.

The data processor/controller 280 may perform various functions for the wireless device 110. For example, the data processor/controller 280 may perform processing for data being received via the receivers 230 and may perform processing for data being transmitted via the transmitters 250. The data processor/controller 280 may control the operations of the various circuits within the transceivers 220 and 222. A memory 282 may store program codes and data for the data processor/controller 280. The data processor/controller 280 may be implemented on one or more application specific integrated circuits (ASICs) and/or other ICs. For other embodiments, the data processor/controller 280 may include or be associated with one or more baseband processing circuits (not shown for simplicity), which in turn may communicate with one or more Media Access Control (MAC) devices (not shown for simplicity) provided within the wireless device 110 of FIG. 1.

The MAC device may include a number of contention engines (not shown for simplicity) that may contend for access to one more shared wireless mediums, and that may also store packets for transmission over the one more shared wireless mediums. The MAC device may include frame formatting circuitry (not shown for simplicity) to create and/or format frames received from the data processor/controller 280 (e.g., by adding MAC headers to PDUs provided by data processor/controller 280), and may be used to re-format frames received from receiver chains 230 (e.g., by stripping MAC headers from frames received from receiver chains 230).

As shown in FIG. 2, a transmitter (e.g., transmitter 250) and a receiver (e.g., receiver 230) may include various amplifiers. For example, the transmitter 250 may include one or more PAs 254 and/or driver amplifiers (not shown for simplicity). In a similar manner, receiver 230 may include one or more LNAs 240 and/or other amplifiers (not shown for simplicity).

For at least some embodiments, the primary transceiver 220 may include a tunable load circuit 340 coupled between an output terminal of one of the power amplifiers 254pa-254pk and an output terminal of another of the power amplifiers 254pa-254pk. Similarly, the secondary transceiver 222 may include a tunable load circuit 340 coupled between an output terminal of one of the power amplifiers 254sa-254sl and an output terminal of another of the power amplifiers 254sa-254sl. As explained in more detail below, the tunable load circuit 340 may provide a different load impedance for each of a plurality of operating modes of the wireless device 110.

Figure 3:
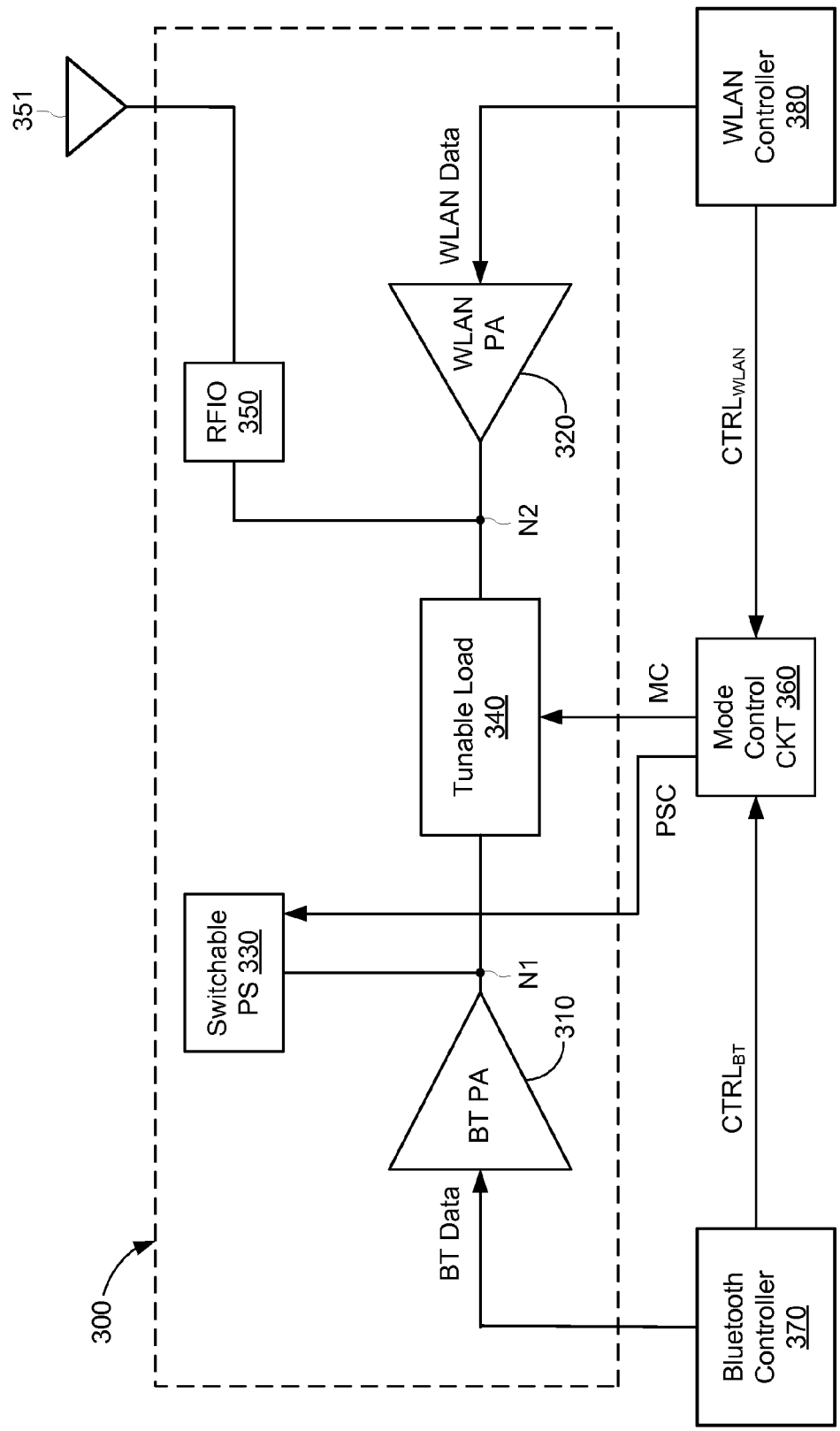
FIG. 3 is a block diagram of an analog front-end (AFE) circuit in accordance with example embodiments.

FIG. 3 shows a block diagram of an analog front-end (AFE) circuit 300 in accordance with example embodiments. The AFE circuit 300, which may be implemented within a host wireless device such as wireless device 110 of FIG. 1, includes a Bluetooth power amplifier (BT PA) 310, a Wi-Fi power amplifier (WLAN PA) 320, a switchable power supply (PS) 330, a tunable load circuit 340, and a shared radio frequency interface (RFIO) circuit 350. The RFIO circuit 350, which is well-known, may provide an interface between antenna 351 and AFE circuit 300. The antenna 351 may be one embodiment of antennas 210 and/or 212 of FIG. 2, and for actual embodiments may be more than one antenna.

The BT PA 310 includes an input terminal to receive Bluetooth data signals, and includes an output terminal to provide amplified Bluetooth data signals at a first node N1.

The switchable power supply 330 is coupled to the output terminal of BT PA 310 at first node N1. The WLAN PA 320 includes an input terminal to receive WLAN data signals, and includes an output terminal to provide amplified WLAN data signals at a second node N2. The antenna 351 is coupled to second node N2 via the RFIO circuit 350. The tunable load circuit 340 is coupled between first node N1 and second node N2 (e.g., between the output terminals of BT PA 310 and WLAN PA 320).

For the example of FIG. 3, the AFE circuit 300 is shown as coupled to a Bluetooth controller 370 and to a WLAN controller 380. The Bluetooth controller 370 may provide Bluetooth data to AFE circuit 300 for transmission to one or more other devices (e.g., via BT PA 310 and antenna 351), and may receive Bluetooth data from one or more other devices via a receive chain (not shown for simplicity) of AFE circuit 300. Similarly, the WLAN controller 380 may provide WLAN data to AFE circuit 300 for transmission to one or more other devices (e.g., via WLAN PA 320 and antenna 351), and may receive WLAN data from one or more other devices via a receive chain of AFE circuit 300. For at least some embodiments, Bluetooth controller 370 and WLAN controller 380 may be part of the data processor/controller 280 of FIG. 2. For other embodiments, Bluetooth controller 370 and WLAN controller 380 may be any suitable circuit, device, or processor (e.g., a baseband processor) that generates and/or processes Bluetooth signals and Wi-Fi signals, respectively.

The AFE circuit 300 may be coupled to (or alternatively may include) a mode control circuit 360. The mode control circuit 360 may control one or more operating modes, settings, and/or configurations of AFE circuit 300 based, at least in part, on one or more WLAN control signals and/or one or more Bluetooth control signals. The one or more WLAN control signals, collectively depicted in FIG. 3 as $CTRL_{WLAN}$, may indicate whether WLAN data is to be transmitted, whether WLAN data is to be received, and/or other information regarding Wi-Fi communications of the host wireless device. The one or more Bluetooth control signals, collectively depicted in FIG. 3 as $CTRL_{BT}$, may indicate whether Bluetooth data is to be transmitted, may indicate whether Bluetooth data is to be received, may indicate a power mode to be used for Bluetooth communications, and/or may be or indicate other information regarding Bluetooth communications of the host wireless device. For the example embodiment shown in FIG. 3, the one or more Bluetooth control signals may be generated by Bluetooth controller 370, and the one or more WLAN control signals may be generated by WLAN controller 380 (although other suitable circuits or devices may generate the control signals $CTRL_{WLAN}$ and $CTRL_{BT}$).

The BT PA 310 may be part of a Bluetooth radio (not shown for simplicity) of the host wireless device, and thus may drive (e.g., amplify) outgoing Bluetooth data signals to a power level specified by one or more Bluetooth standards. The WLAN PA 320 may be part of a Wi-Fi radio (not shown for simplicity) of the host wireless device, and may drive (e.g., amplify) outgoing WLAN data signals to a power level specified by one or more IEEE 802.11 standards. Thus, for at least some embodiments, the BT PA 310 and the WLAN PA 320 may each be one embodiment of the power amplifiers 254 of FIG. 2.

As described above, Bluetooth and Wi-Fi communications typically occupy the 2.4 GHz frequency band. Wi-Fi communications are designed for relatively medium-to-long range communications, and Bluetooth communications are designed for relatively short range communications. Accordingly, the transmit power of the WLAN PA 320 may be significantly greater than the transmit power of the BT PA 310. Moreover, the BT PA 310 may operate in several different power modes (e.g., a Bluetooth high power mode, a Bluetooth low power mode, and a Bluetooth ultra-low power mode), while the WLAN PA 320 typically operates in a single power mode.

To achieve optimum power transmission efficiency for the WLAN PA 320, the output load impedance provided by the tunable load circuit 340 may be "matched" to the impedance that the WLAN PA 320 is able to drive with an acceptable level of efficiency (e.g., a level of efficiency that is greater than a threshold). This technique, which may be referred to herein as "impedance matching," may be used to maximize the ratio of transmitted power to lost power. However, because the WLAN PA 320 and the BT PA 310 typically operate at different power levels (e.g., to transmit WLAN signals and Bluetooth signals, respectively, at different power levels), a load impedance that optimizes power transmission efficiency for the WLAN PA 320 may be less than optimal for the BT PA 310 (and a load impedance that optimizes power transmission efficiency for the BT PA 310 may be less than optimal for the WLAN PA 320).

In example embodiments, the tunable load circuit 340 may be dynamically configured or adjusted to provide a first load impedance that matches the input impedance of the WLAN PA 320 during WLAN transmissions (e.g., to maximize the power transmission efficiency of the WLAN PA 320), and may be dynamically configured or adjusted to provide a second load impedance that matches the input impedance of the BT PA 310 during Bluetooth transmissions (e.g., to maximize the power transmission efficiency of the BT PA 310). In addition, the tunable load circuit 340 may be configured to isolate the BT PA 310 from RFIO circuit 350 and antenna 351 during WLAN transmissions, and may be configured to isolate the WLAN PA 320 from RFIO circuit 350 and antenna 351 during Bluetooth transmissions.

More specifically, for example embodiments, the tunable load circuit 340 may selectively operate in two or more operating modes based, at least in part, on a mode control (MC) signal provided by the mode control circuit 360. The mode control circuit 360 may generate the MC signal based on the WLAN control signal $CTRL_{WLAN}$ and/or the Bluetooth control signal $CTRL_{BT}$. For example, in a Wi-Fi mode of operation, the WLAN PA 320 drives WLAN signals through AFE circuit 300 for wireless transmission to one or more other wireless devices via antenna 351, while in a Bluetooth mode of operation, the BT PA 310 drives Bluetooth signals through AFE circuit 300 for wireless transmission to one or more other wireless devices via antenna 351. Because the voltage swing and transmit power of WLAN signals is typically greater than the voltage swing and transmit power of Bluetooth signals, the tunable load circuit 340 may provide a lower load impedance during the Wi-Fi mode of operation than in the Bluetooth mode of operation.

As mentioned above, Bluetooth devices may operate according to several different power modes including, for example, a high power mode, a low power mode, and an ultra-low power mode. Thus, for at least some embodiments, the tunable load circuit 340 may provide, during the Bluetooth mode of operation, a different load impedance for each of the different Bluetooth power modes, for example, so that the BT PA 310 may drive outgoing Bluetooth data signals to different power levels. The switchable power supply 330 may select a supply voltage for the BT PA 310 in response to a power selection control (PSC) signal provided by mode control circuit 360. The mode control circuit 360 may generate the PSC signal based, at least in part, on control signals $CTRL_{WLAN}$ and/or $CTRL_{BT}$.

For some implementations, the selection of a supply voltage to be provided by the switchable power supply 330 may be coordinated with the load impedance provided by the tunable load circuit 340 to maximize the power transmission efficiency of the BT PA 310 for each of the different Bluetooth power modes.

Figure 4A:
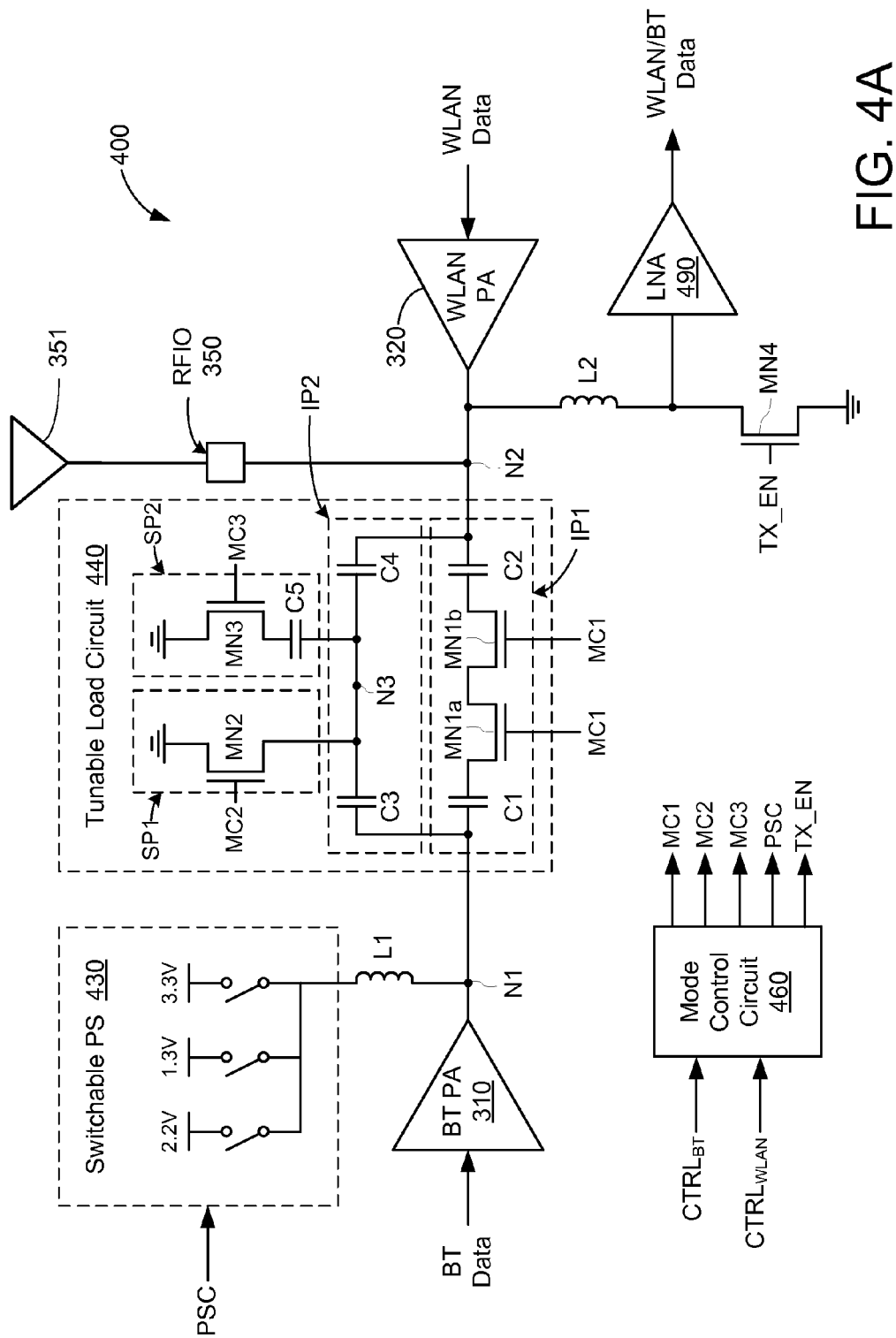
FIG. 4A is a circuit diagram of an example embodiment of the AFE circuit of FIG. 3.

FIG. 4A shows a circuit diagram of an AFE circuit 400 that may be one embodiment of the AFE circuit 300 of FIG. 3. The AFE circuit 400 includes BT PA 310, WLAN PA 320, a switchable power supply 430, a tunable load circuit 440, a mode control circuit 460, and a low noise amplifier (LNA) 490. For simplicity, the Bluetooth controller 370 and the WLAN controller 380 described above with respect to FIG. 3 are not shown in FIG. 4A.

The switchable power supply 430 may be one embodiment of switchable power supply 330 of FIG. 3, the tunable load circuit 440 may be one embodiment of tunable load circuit 340 of FIG. 3, and the mode control circuit 460 may be one embodiment of mode control circuit 360 of FIG. 3. The switchable power supply 430 and tunable load circuit 440 may be configured to maximize the power transmission efficiency of the WLAN PA 320 during the Wi-Fi mode of operation and to maximize the power transmission efficiency of the BT PA 310 for each of the Bluetooth power modes (e.g., high power mode, low power mode, and ultra-low power mode), as described in more detail below.

The switchable power supply 430 includes a number of supply voltages (e.g., 1.3V, 2.2V, and 3.3V) that may be selectively coupled to the BT PA 310 in response to the PSC signal, which as described above may be indicative of a Bluetooth power mode and/or indicative of whether AFE circuit 400 is transmitting Bluetooth signals. The selected supply voltage may provide power to the BT PA 310 via an inductor L1. The Bluetooth power mode may depend on the class of the Bluetooth device that generates the Bluetooth data signals. For example, Class 1.5 Bluetooth devices typically operate in a "high power" mode, whereas Class 2 Bluetooth devices may operate in a "low power" mode or an "ultra-low power" mode. In example embodiments, a particular supply voltage (e.g., either 1.3V, 2.2V or 3.3V) may be selected so that the BT PA 310 may drive Bluetooth data signals to a desired power level (e.g., to a power level suitable for the corresponding class of Bluetooth device).

Figure 4B:
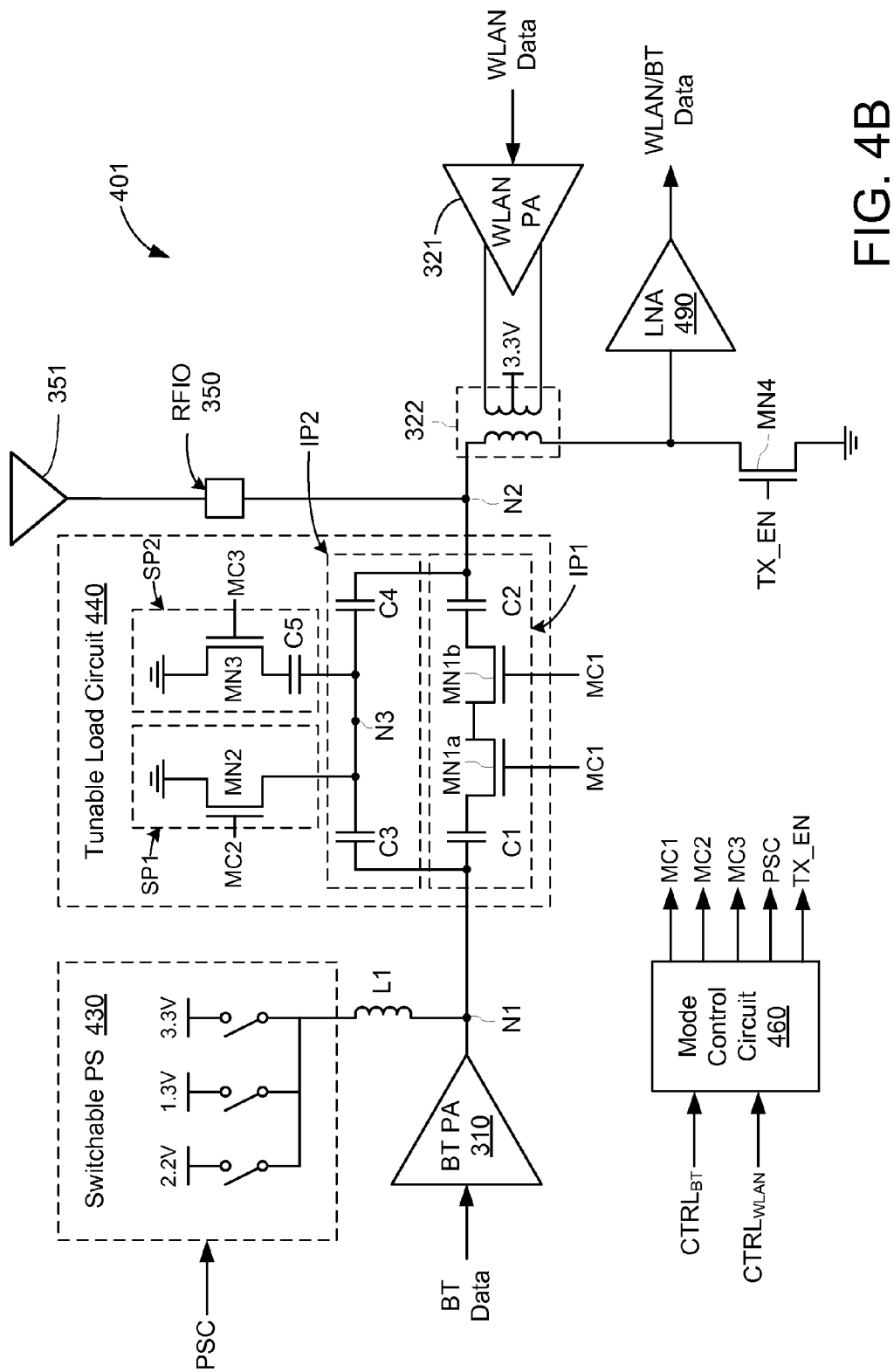
FIG. 4B is a circuit diagram of another example embodiment of the AFE circuit of FIG. 3.

Although not shown in FIG. 4A for simplicity, the WLAN PA 320 may receive a supply voltage from a separate power supply. Further, for at least some embodiments, the WLAN PA 320 may be a differential amplifier having differential output terminals coupled to second node N2 by a balun, for example, as depicted in FIG. 4B. More specifically, the AFE circuit 401 of FIG. 4B is similar to the AFE circuit 400 of FIG. 4A, except that the single-ended WLAN PA 320 of FIG. 4A is replaced by a differential WLAN PA 321 that is coupled to node N2 via a balun 322. The balun 322, which may convert a differential WLAN signal provided by the differential WLAN PA 321 to a single-ended WLAN signal at node N2, is well-known and therefore not described in detail herein.

The tunable load circuit 440, which is shown to include a number of capacitors C1-C5 and a number of NMOS transistors MN1a, MN1b, MN2 and MN3, may provide variable load impedances in response to mode control signals MC1-MC3. Although shown in FIG. 4A as NMOS devices, transistors MN1a, MN1b, MN2, and/or MN3 may, for other embodiments, be PMOS devices (or any other technically feasible transistors such as BiCMOS, JFET, or BJT devices).

Capacitor C1 is coupled to the output terminal of the BT PA 310 (at first node N1), capacitor C2 is coupled to an output terminal of WLAN PA 320 and an input terminal of the RFIO circuit 350 (at second node N1), and transistors MN1a and MN1b are coupled in series between capacitors C1 and C2. Transistors MN and MN each include a gate to receive mode control signal MC1. Together, transistors MN1a-MN1b and capacitors C1-C2 form a first impedance path (IP1) between first node N1 and second node N2.

Capacitors C3 and C4 are coupled in series between first node N1 and second node N2, and together form a second impedance path (IP2) between first node N1 and second node N2 (e.g., where the second impedance path is in parallel with the first impedance path between nodes N1 and N2).

Transistor MN2 is coupled a third node N3 (residing between capacitors C3 and C4) and ground potential, and includes a gate to receive a second mode control signal MC2. Capacitor C5 and transistor MN3 are coupled in series between third node N3 and ground potential, and transistor MN3 includes a gate to receive a third mode control signal MC3. Transistor MN2 forms a first shunt path (SP1) between node N3 and ground potential, and transistor MN3 and capacitor C5 form a second shunt path (SP2) between node N3 and ground potential.

For some embodiments, capacitors C1, C2, and C5 may have relatively large capacitance values (e.g., compared to capacitors C3 and C4), and capacitors C3 and C4 may have relatively small capacitance values (e.g., compared to capacitors C1, C2, and C5). For at least one example embodiment, capacitor C1 has a capacitance value of approximately 6.6 pico-Farads (pF), capacitor C2 has a capacitance value of approximately 3.3 pF, capacitor C3 has a capacitance value of approximately 1.5 pF, capacitor C4 has a capacitance value of approximately 0.75 pF, and capacitor C5 has a capacitance value of approximately 1.3 pF. Thus, because the impedance (Z) of a capacitor is inversely related to its capacitance (i.e., $Z=1/j\omega C$), the series connection of capacitors C1 and C2 may provide a lower impedance path between nodes N1 and N2 than the series connection of capacitors C3 and C4. For the discussion that follows, the impedances of capacitors C1-C5 may be expressed as $Z_1$-$Z_5$, respectively.

For example embodiments, the tunable load circuit 440 may be configured to provide different load impedances by selectively turning on (e.g., activating) and/or turning off (e.g., deactivating) different combinations of transistors MN1a, MN1b, MN2, and MN3. Further, when AFE circuit 400 is transmitting Bluetooth data signals, the switchable power supply 430 may be configured to provide a particular supply voltage to the BT PA 310 depending on the selected Bluetooth power mode.

The LNA 490, which includes an input terminal coupled to antenna 351 via RFIO circuit 350 and includes an output terminal coupled to processing circuitry on the host wireless device, may be used to amplify Bluetooth and/or WLAN data signals received via antenna 351. In example embodiments, an inductor L2 is coupled between node N2 and the input terminal of LNA 490, and an NMOS transistor MN4 is coupled between the input terminal of LNA 490 and ground potential. Transistor MN4 includes a gate to receive a transmission enable signal (TX_EN). The inductor L2 may be inductively coupled to a matching network (not shown for simplicity) within the WLAN PA 320. As explained in more detail below, transistor MN4 may act as a shunt to ground, for the LNA 490, when the AFE circuit 400 operates in a transmit mode (e.g., in response to an assertion of the TX_EN signal). Thus, for the discussion herein, transistor MN4 may be referred to as a shunt transistor. More specifically, turning on transistor MN4 may prevent LNA 490 from sampling outgoing data signals from the BT PA 310 and/or the WLAN PA 320. Although shown in FIG. 4A as an NMOS device, transistor MN4 may be a PMOS device (or any other technically feasible transistor such as a BiCMOS, JFET, or BJT device).

The mode control circuit 460 includes input terminals to receive control signals $CTRL_{BT}$ and $CTRL_{WLAN}$, and includes output terminals to generate the mode control signals MC1-MC3, the power select control signal (PSC), and the transmission enable signal (TX_EN). As described in more detail below, mode control circuit 460 may control the operation and/or configuration of the switchable power supply 430, the tunable load circuit 440, and transistor MN4 based on an operating mode of AFE circuit 400 (e.g., as may be indicated or derived from control signals $CTRL_{BT}$ and $CTRL_{WLAN}$).

When AFE circuit 400 is to operate in the Wi-Fi mode (e.g., so that the WLAN PA 320 may drive WLAN data signals to antenna 351 via RFIO circuit 350), the switchable power supply 430 is turned off (e.g., in response to a disabled state of the PSC signal), thereby isolating first node N1 from all of the supply voltages associated with the switchable power supply 430. Further, the tunable load circuit 440 may be configured, in response to mode control signals MC1-MC3, to provide a very low (e.g., a minimum non-zero) load impedance during the Wi-Fi mode. This very low load impedance may allow the WLAN PA 320 to drive the Wi-Fi signals to a desired high power level. More specifically, mode control signal MC1 is de-asserted (e.g., to logic low), and mode control signals MC2-MC3 are asserted (e.g., to logic high). In response thereto, transistors MN1$a$ and MN1$b$ are turned off, and transistors MN2 and MN3 are turned on. Because transistors MN1$a$ and MN1$b$ are not conductive, capacitors C1 and C2 are de-coupled from tunable load circuit 440, and therefore may not affect the impedance of the tunable load circuit 440.

The conductive states of transistors MN2 and MN3 may provide a shunt for the tunable load circuit 440, for example, by pulling the third node N3 to ground potential. This shunt to ground potential may significantly reduce the load impedance seen at the output terminal of WLAN PA 320 (e.g., to a minimum non-zero impedance), thereby allowing the WLAN PA 320 to drive output signals with a higher voltage swing that would be possible with a higher load impedance. In this configuration, the load impedance $Z_L$ of tunable load circuit 440 may be expressed as $Z_1 \sim Z_4$.

Moreover, any residual charges on capacitors C3 and C4 accumulated during any of the Bluetooth power modes (which are described below) may be quickly discharged to ground potential by transistors MN2 and MN3, thereby improving the clarity of WLAN data signals driven to antenna 351 by WLAN PA 320.

An equivalent circuit diagram 501 of the AFE circuit 400, when configured to operate in the Wi-Fi mode, is shown in FIG. 5A.

When AFE circuit 400 is to operate in a Bluetooth high power mode, the switchable power supply 430 selects a first supply voltage value of 3.3V for the BT PA 310 (e.g., in response to a first enabled state of the PSC signal). Further, the tunable load circuit 440 may be configured, in response to mode control signals MC1-MC3, to provide a first load impedance during the Bluetooth high power mode. For some embodiments, the first load impedance may be a "relatively low" load impedance, for example, as compared with load impedance values provided for other operating modes. More specifically, mode control signal MC1 is asserted (e.g., to logic high), and mode control signals MC2-MC3 are de-asserted (e.g., to logic low). In response thereto, transistors MN1$a$ and MN1$b$ are turned on, and transistors MN2 and MN3 are turned off. The non-conductive states of transistors MN2 and MN3 isolate the third node N3 from ground potential. Because transistors MN1$a$ and MN1$b$ are conductive, capacitors C1 and C2 are coupled together and form the first impedance path between nodes N1 and N2, and capacitors C3 and C4 form the second impedance path between nodes N1 and N2. In this configuration, the load impedance $Z_L$ may be expressed as $Z_L=(Z_1+Z_2)\|(Z_3+Z_4)$. As a result, tunable load circuit 440 provides the first load impedance (e.g., a relatively "low" load impedance) at the output terminal of the BT PA 310 to maximize the power transmission efficiency of the BT PA 310 when transmitting Bluetooth signals at high power levels. For example, because the output power may be expressed as $P_{out}=V^2/2R$ (where R is the load impedance), reducing the load impedance provided by tunable load circuit 440 to the first (e.g., relatively low) load impedance value and providing the high supply voltage of 3.3V may maximize the output power of the Bluetooth signals for the Bluetooth high power mode. For at least one embodiment, the first load impedance may have a relatively "low" value of approximately 50Ω.

Figure 5B:
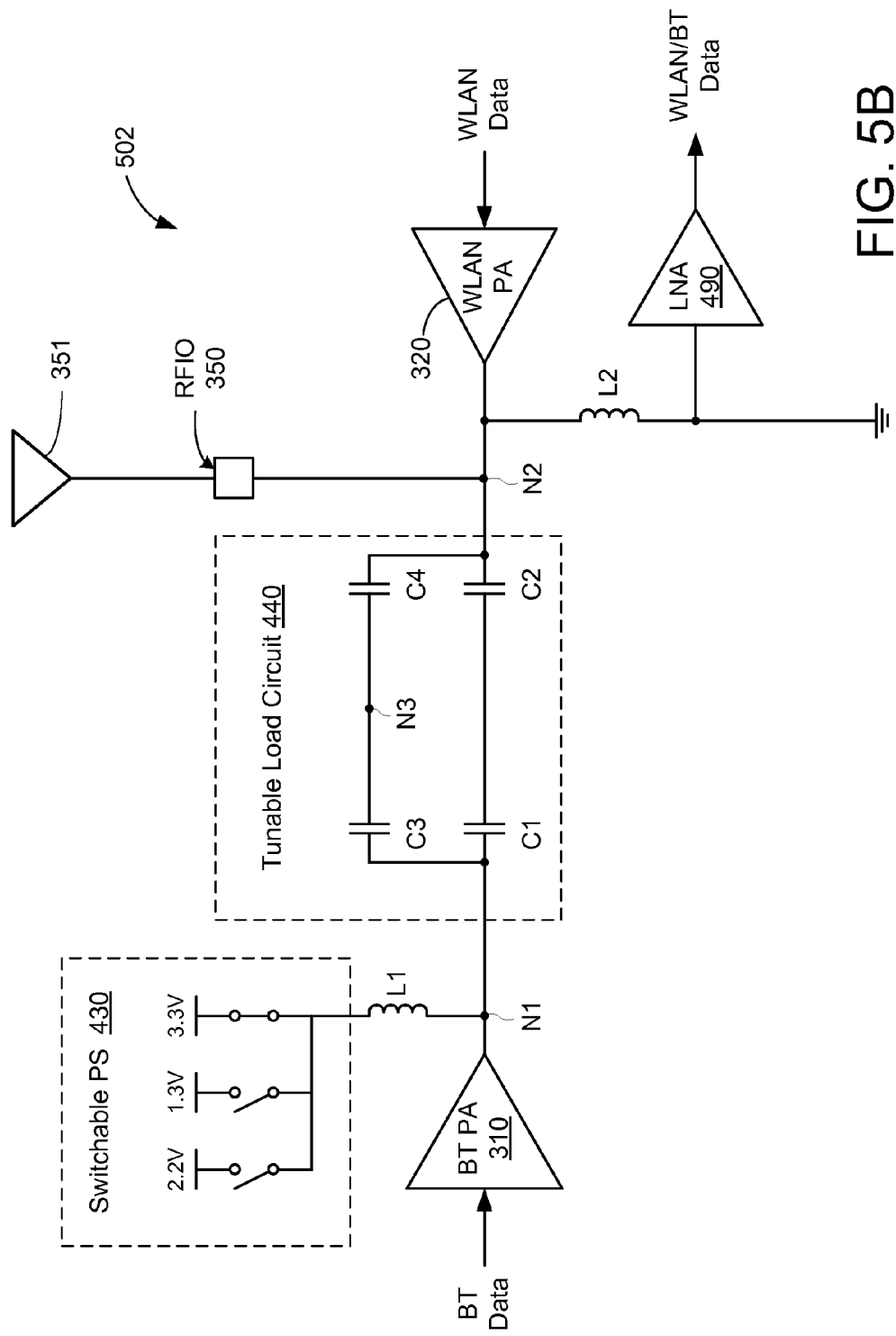
FIG. 5B is a circuit diagram of the AFE circuit of FIG. 4A when configured for an example first Bluetooth mode of operation.

An equivalent circuit diagram 502 of the AFE circuit 400, when configured to operate in the Bluetooth high power mode, is shown in FIG. 5B.

When AFE circuit 400 is to operate in a Bluetooth low power mode, the switchable power supply 430 selects a second supply voltage value of 1.3V for the BT PA 310 (e.g., in response to a second enabled state of the PSC signal). Further, the tunable load circuit 440 may be configured, in response to mode control signals MC1-MC3, to provide a second load impedance during the Bluetooth low power mode. For some embodiments, the second load impedance may be a "relatively medium" load impedance, for example, as compared with load impedance values provided for other operating modes. More specifically, all of mode control signals MC1-MC3 are de-asserted (e.g., to logic low), which turns off all transistors MN1$a$, MN1$b$, MN2, and MN3 of the tunable load circuit 440. The non-conductive states of transistors MN1$a$ and MN1$b$ prevent capacitors C1 and C2 from affecting the impedance of the tunable load circuit 440, and the non-conductive states of transistors MN2 and MN3 isolate third node N3 from ground potential. In this configuration, the load impedance $Z_L$ may be expressed as $Z_L=Z_3+Z_4$. As a result, tunable load circuit 440 provides the second load impedance (e.g., a relatively "medium" load impedance) at the output terminal of the BT PA 310 to maximize the power transmission efficiency of the BT PA 310 when transmitting Bluetooth signals in the Bluetooth low power mode. For example, because the output power may be expressed as $P_{out}=V^2/2R$, providing the second (e.g., the relatively medium) load impedance and providing the low supply voltage of 1.3V may reduce the output power of the Bluetooth signals for the Bluetooth low power mode (e.g., as compared with the Bluetooth high power mode). For at least one embodiment, the second load impedance may have a relatively "medium" value of approximately 80Ω.

Figure 5C:
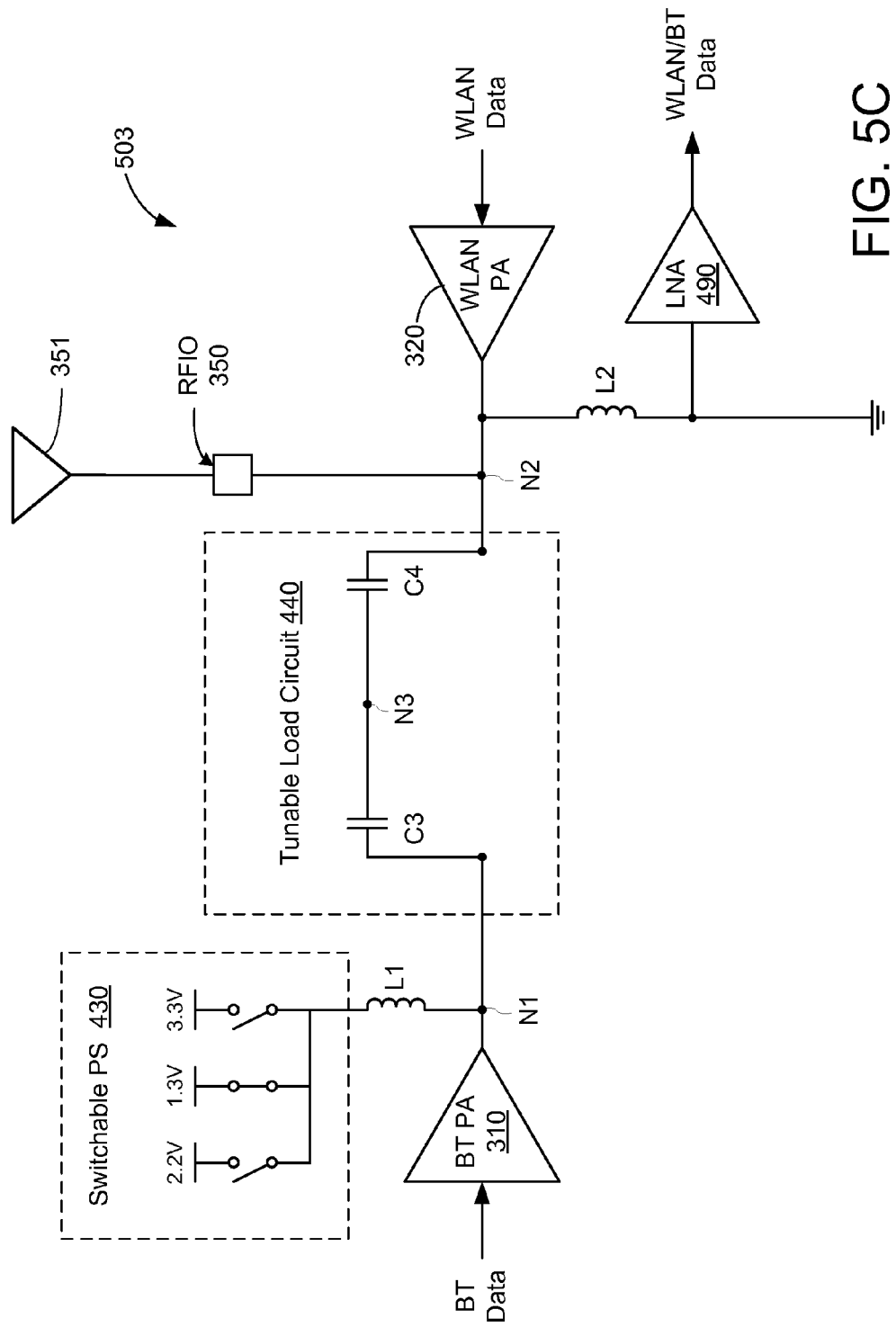
FIG. 5C is a circuit diagram of the AFE circuit of FIG. 4A when configured for an example second Bluetooth mode of operation.

An equivalent circuit diagram 503 of the AFE circuit 400, when configured to operate in the Bluetooth low power mode, is shown in FIG. 5C.

When AFE circuit 400 is to operate in a Bluetooth ultra-low power mode, the switchable power supply 430 selects the second supply voltage value of 1.3V for the BT PA 310 (e.g., in response to the second enabled state of the PSC signal). Further, the tunable load circuit 440 may be configured, in response to mode control signals MC1-MC3, to provide a third load impedance during the Bluetooth ultra-low power mode. For some embodiments, the third load impedance may be a "relatively high" load impedance, for example, as compared with load impedance values provided for other operating modes. More specifically, mode control signal MC3 is asserted (e.g., to logic high), and mode control signals MC1-MC2 are de-asserted (e.g., to logic low). In response thereto, transistors MN1a, MN1b, and MN2 are turned off, and transistor MN3 is turned on. The conductive state of transistor MN3 couples capacitor C5 to ground potential, and the non-conductive state of transistor MN2 de-couples the shunt path between third node N3 and ground potential. The non-conductive states of transistors MN1a and MN1b de-couple capacitors C1 and C2 from tunable load circuit 440 (and therefore may not affect the impedance of the tunable load circuit 440). In this configuration, the load impedance $Z_L$ may be expressed as $Z_L=Z_4+(Z_3\|Z_5)$. As a result, tunable load circuit 440 provides the third load impedance (e.g., a relatively high load impedance) at the output terminal of the BT PA 310 to maximize the power transmission efficiency of the BT PA 310 when transmitting Bluetooth signals at ultra-low power levels. For example, because the output power may be expressed as $P_{out}=V^2/2R$, providing the third (e.g., relatively high) load impedance and providing the low supply voltage of 1.3V may further reduce the output power of the Bluetooth signals for the Bluetooth ultra-low power mode (e.g., as compared with the Bluetooth low power mode). For at least one embodiment, the third load impedance may have a relatively high value of approximately 100Ω.

Figure 5D:
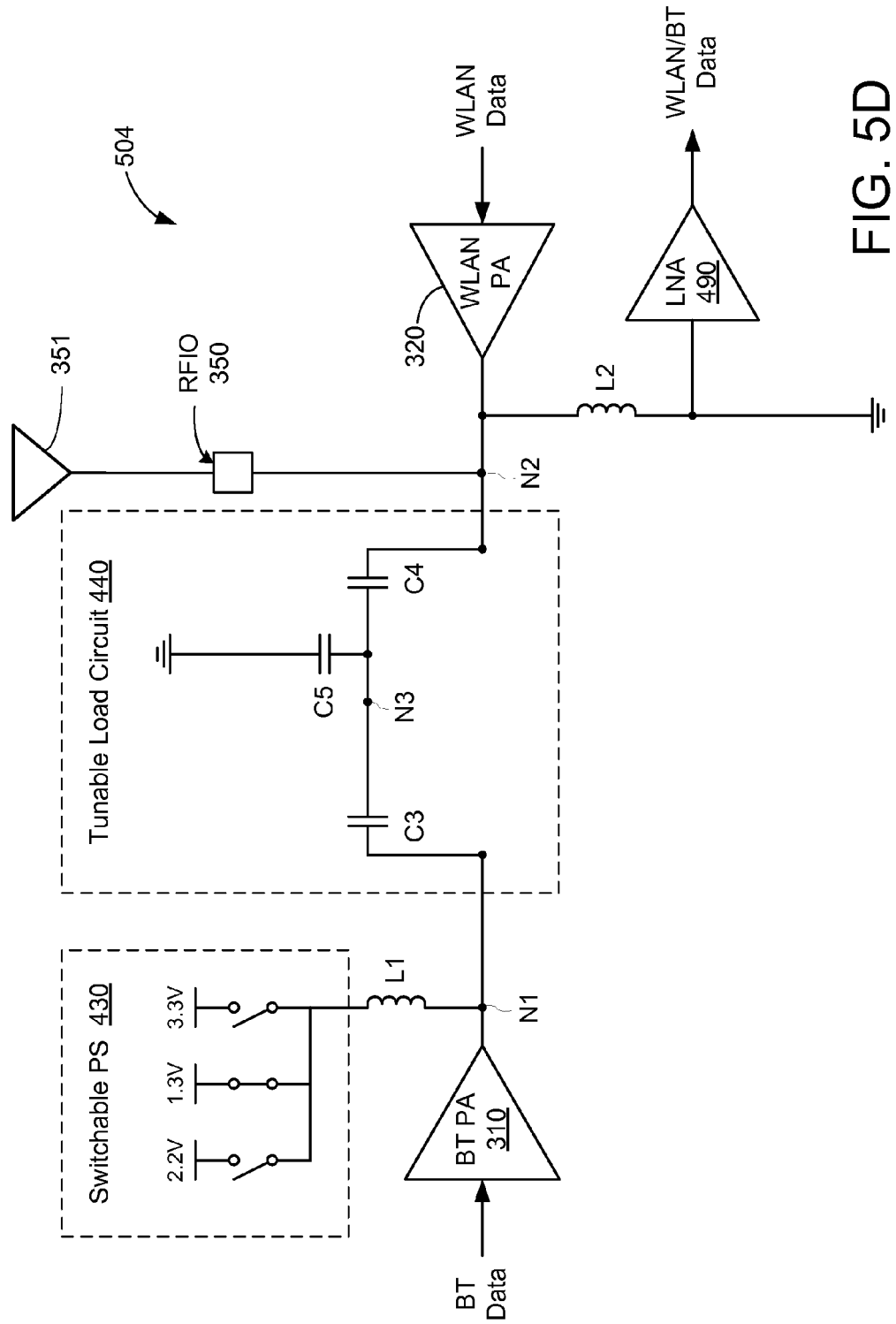
FIG. 5D is a circuit diagram of the AFE circuit of FIG. 4A when configured for an example third Bluetooth mode of operation.

An equivalent circuit diagram 504 of the AFE circuit 400, when configured to operate in the Bluetooth ultra-low power mode, is shown in FIG. 5D.

For the example embodiments described above, capacitors C3 and C4 remain coupled between nodes N1 and N2 for all Bluetooth power modes. By using the series combination of capacitors C3 and C4 to provide different load impedances for the high power, low power, and ultra-low power Bluetooth power modes, the circuit area of the tunable load circuit 440 may be reduced (e.g., as compared with conventional solutions that selectively couple a different set of capacitors to the output terminal of the BT PA 310 for each of the different Bluetooth power modes). More specifically, conventional load circuits that include a separate impedance path for each of the different Bluetooth power modes and/or for the Wi-Fi mode require more transistors (e.g., switches) and capacitors than embodiments of the present disclosure.

When AFE circuit 400 is to operate in a receive mode (e.g., to receive WLAN and/or Bluetooth signals from another wireless device via antenna 351), the switchable power supply 430 is turned off (e.g., in response to a disabled state of the PSC signal), thereby isolating first node N1 from all of the supply voltages associated with the switchable power supply 430. Further, the tunable load circuit 440 may be configured, in response to mode control signals MC1-MC3, to isolate antenna 351 and RFIO circuit 350 from the BT PA 310, for example, so that voltages induced at second node N2 by the received WLAN and/or Bluetooth signals do not damage the BT PA 310. More specifically, all of mode control signals MC1-MC3 are de-asserted (e.g., to logic low), which turns off all transistors MN1a, MN1b, MN2, and MN3 of the tunable load circuit 440. The non-conductive states of transistors MN1a and MN1b isolate the BT PA 310 from second node N2 via the first impedance path formed by capacitors C1 and C2, and the non-conductive states of transistors MN2 and MN3 isolate third node N3 from ground potential by disabling the first and second shunt paths to ground potential. In this configuration, the capacitors C3 and C4 may block DC components of the received WLAN and/or Bluetooth signals, for example, so that transistors (not shown for simplicity) that form BT PA 310 are not damaged by voltage swings at node N2 induced by the received WLAN and/or Bluetooth signals.

In addition, the mode control circuit 460 de-asserts the TX_EN signal (e.g., to logic low), which turns off transistor MN4. The non-conductive state of transistor MN4 isolates the input terminal of LNA 490 from ground potential, thereby allowing the received WLAN and/or Bluetooth signals to be provided to the input terminal of LNA 490. The LNA 490 amplifies the received WLAN and/or Bluetooth signals, and provides the amplified WLAN and/or Bluetooth signals to one or more other circuits for processing. For some embodiments, the amplified Bluetooth signals may be provided to Bluetooth controller 370, and the amplified WLAN signals may be provided to WLAN controller 380 (see also FIG. 3). In this manner, the AFE circuit 400 may receive WLAN signals and Bluetooth signals at the same time.

Although only one LNA 490 is shown in FIG. 4A for simplicity, for actual embodiments, AFE circuit 400 may include a number of first LNAs 490 to amplify received Bluetooth signals, and may include a number of second LNAs 490 to amplify received WLAN signals. The transconductance (Gm) value of the first LNAs may be set to a first value to filter WLAN signals, and the Gm value of the second LNAs may be set to a second value to filter Bluetooth signals. In this manner, AFE circuit 400 may discriminate between the received Bluetooth signals and the received WLAN signals using two sets of LNAs that have different Gm values.

Figure 5E:
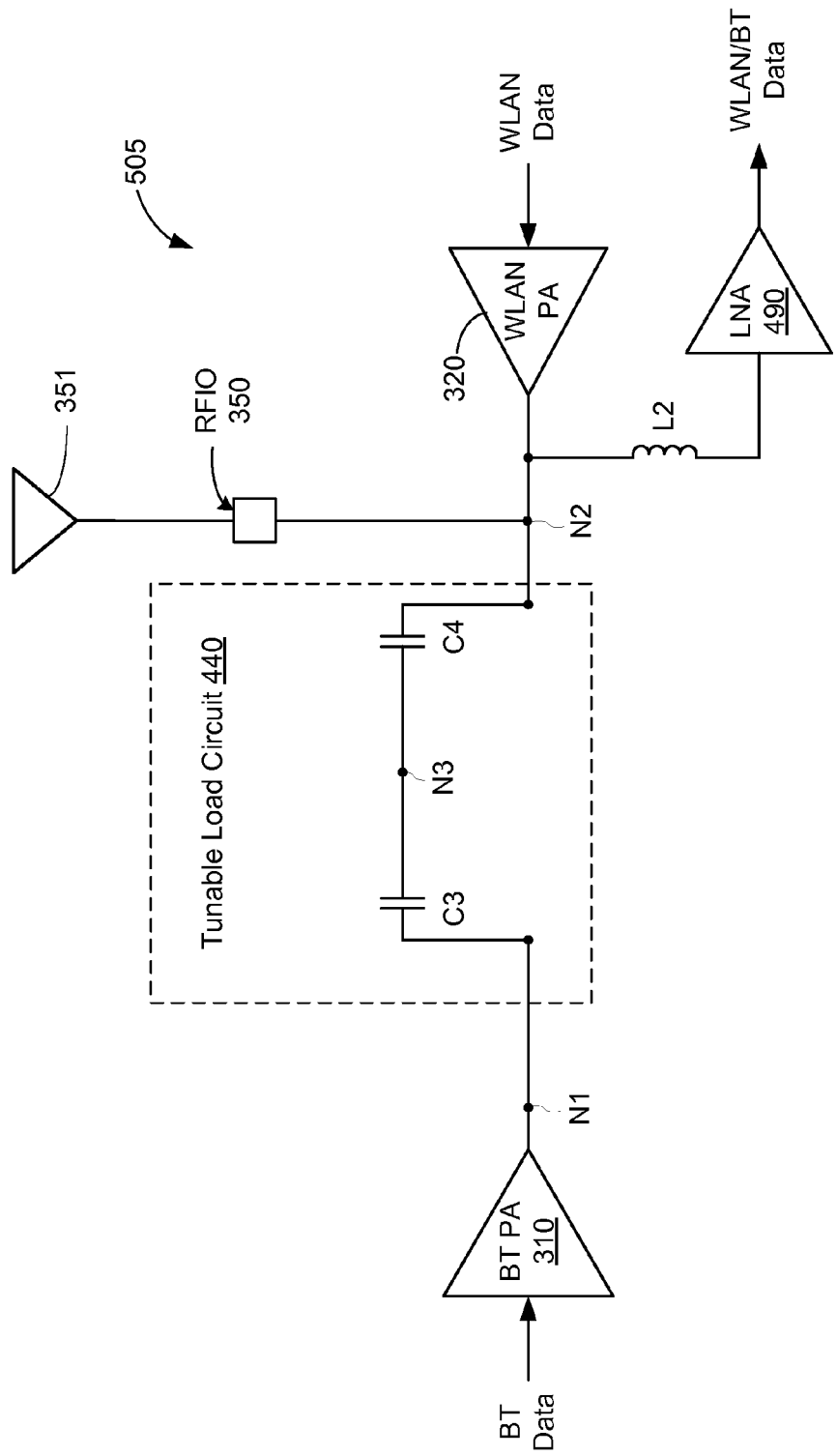
FIG. 5E is a circuit diagram of the AFE circuit of FIG. 4A when configured for an example receive mode of operation.

An equivalent circuit diagram 505 of the AFE circuit 400, when configured to operate in the receive mode, is shown in FIG. 5E.

The configurations of the AFE circuit 400 for each of the above-described modes of operation are summarized in Table 1 below.

TABLE 1

| Operating Mode | Switchable PS | MN1a | MN1b | MN2 | MN3 | MN4 |
|---|---|---|---|---|---|---|
| WLAN Transmit (TX) | OFF | OFF | OFF | ON | ON | ON |
| BT High Power TX | 3.3 V | ON | ON | OFF | OFF | ON |
| BT Low Power TX | 1.3 V | OFF | OFF | OFF | OFF | ON |
| BT Ultra-Low Power TX | 1.3 V | OFF | OFF | OFF | ON | ON |
| Receive (RX) | OFF | OFF | OFF | OFF | OFF | OFF |

As mentioned above, for at least one example embodiment, capacitor C1 has a capacitance value of approximately 6.6 pF, capacitor C2 has a capacitance value of approximately 3.3 pF, capacitor C3 has a capacitance value of approximately 1.5 pF, capacitor C4 has a capacitance value of approximately 0.75 pF, and capacitor C5 has a capacitance value of approximately 1.3 pF. As such, the load impedances provided by tunable load circuit 440 for the different operating modes described above may be summarized below in Table 2.

TABLE 2

| Operating Mode | Z expression | Z value |
| --- | --- | --- |
| WLAN Transmit (TX) | $Z_L \sim Z_4$ | <50 Ω |
| BT High Power TX | $Z_L = (Z_1 + Z_2) \parallel (Z_3 + Z_4)$ | 50 Ω |
| BT Low Power TX | $Z_L = Z_3 + Z_4$ | 80 Ω |
| BT Ultra-Low Power TX | $Z = Z_4 + (Z_3 \parallel Z_5)$ | 100 Ω |
| Receive (RX) | OFF | Very high |

Figure 4C:
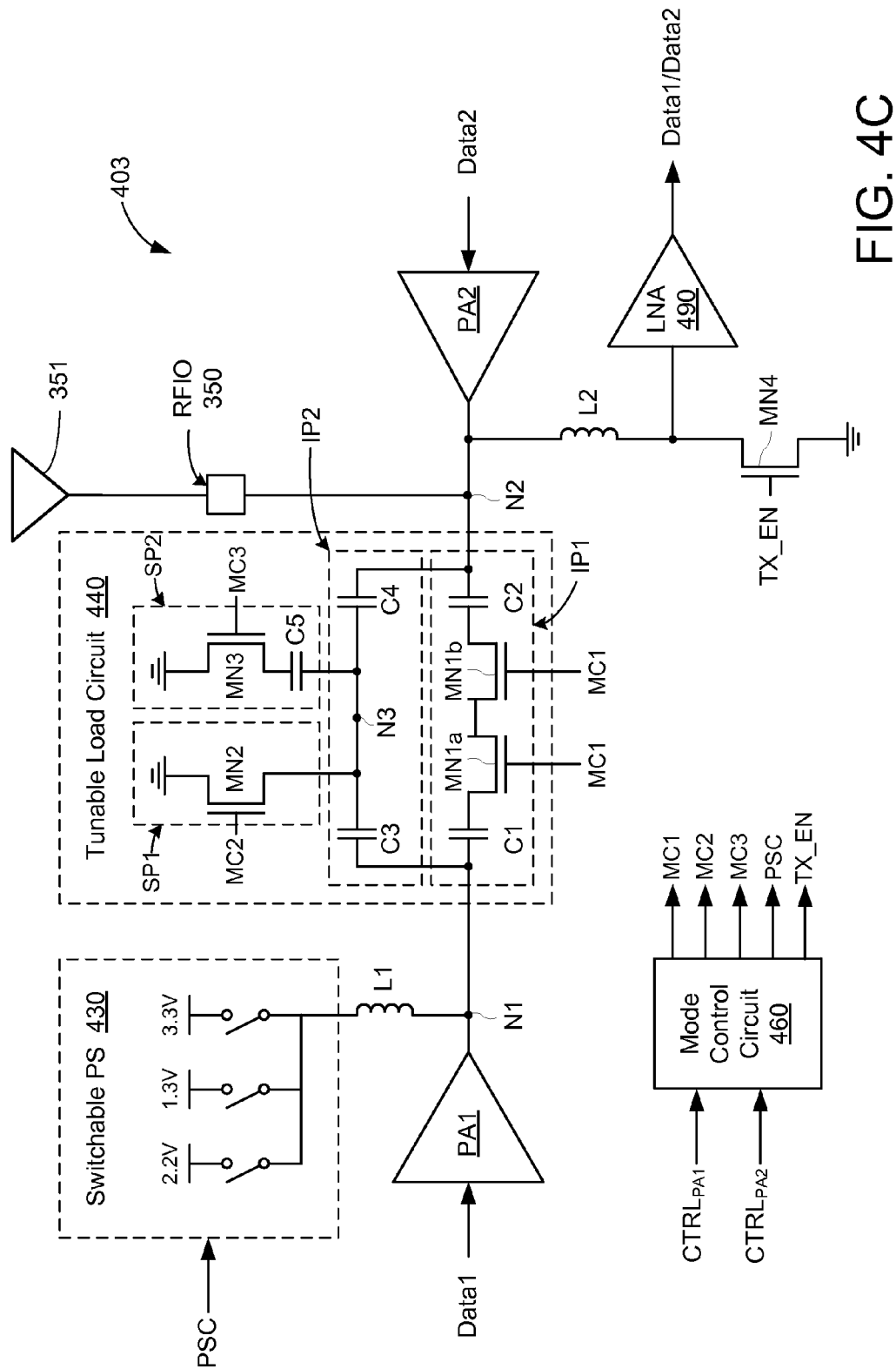
FIG. 4C is a circuit diagram of yet another example embodiment of the AFE circuit of FIG. 3.

FIG. 4C shows a circuit diagram of an AFE circuit 403 that may be another embodiment of the AFE circuit 300 of FIG. 3. The AFE circuit 403 is similar to the AFE circuit 400 of FIG. 4A, except that the BT PA 310 is replaced by a first power amplifier PA1, the WLAN PA 320 is replaced by a second power amplifier PA2, the control signal $CTRL_{BT}$ is replaced by a control signal $CTRL_{PA1}$, and the control signal $CTRL_{WLAN}$ is replaced by a control signal $CTRL_{PA2}$. Specifically, the first power amplifier PA1 may amplify first data signals (Data1) for wireless transmission via antenna 351 during a first operating mode, and the second power amplifier PA2 may amplify second data signals (Data2) for wireless transmission via antenna 351 during a second operating mode. The operating mode may be controlled by control signals MC1-MC3, PSC, and TX_EN in response to control signals $CTRL_{PA1}$ and $CTRL_{PA2}$.

Figure 6:
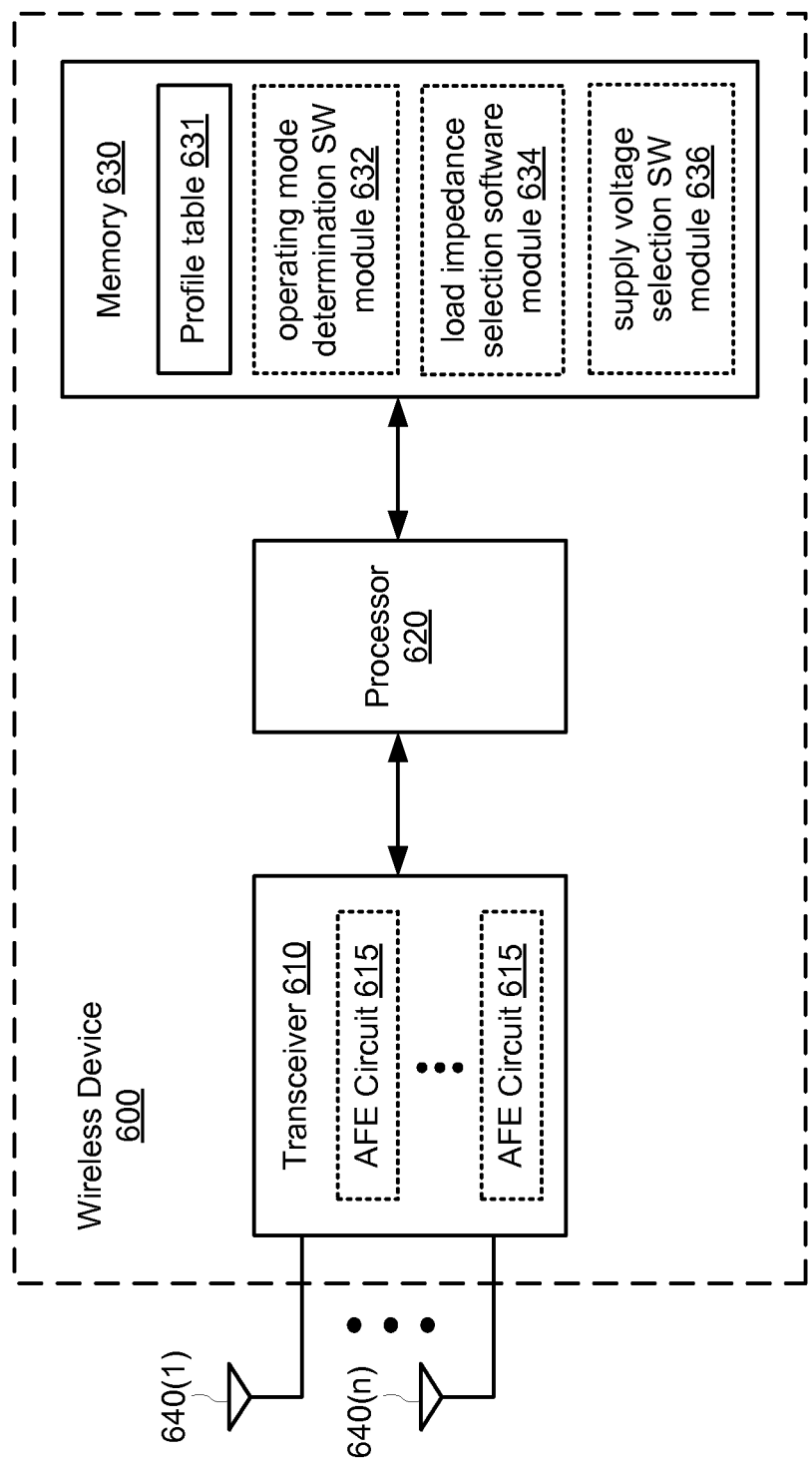
FIG. 6 is a block diagram of an example wireless device within which the example embodiments may be implemented.

FIG. 6 shows a wireless device 600 that may be an example embodiment of wireless device 110 of FIGS. 1-2. The wireless device 600 may include a transceiver 610, a processor 620, a memory 630, and a number of antennas 640(1)-640(n). The transceiver 610 may be used to transmit signals to and receive signals from other wireless devices via one or more of antennas 640(1)-640(n), and may be used to scan the surrounding environment to detect and identify other wireless devices. Transceiver 610 is shown to include a number of AFE circuits 615, one or more of which may be an embodiment of AFE circuit 400 of FIG. 4A, the AFE circuit 401 of FIG. 4B, the AFE circuit 403 of FIG. 4C, and/or AFE circuit 300 of FIG. 3. Although not shown in FIG. 6 for simplicity, transceiver 610 may include any number of transmit chains to process and transmit signals to other wireless devices via antennas 640(1)-640(n), and may include any number of receive chains to process signals received from antennas 640(1)-640(n). Thus, for example embodiments, the wireless device 600 may be configured for MIMO operations including, for example, SU-MIMO operations and MU-MIMO operations.

More generally, transceiver 610 may include one or more Wi-Fi transceivers, Bluetooth transceivers, cellular transceivers, and/or other suitable radio frequency (RF) transceivers to transmit and receive wireless communication signals. Each transceiver may communicate with other wireless devices in distinct operating frequency bands and/or using distinct communication protocols. For example, the Wi-Fi transceiver may communicate within a 2.4 GHz frequency band and/or within a 5 GHz frequency band in accordance with the IEEE 802.11 standards. The cellular transceiver may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the transceivers included within the wireless device 600 may be any technically feasible transceiver such as a ZigBee transceiver described by a specification from the ZigBee specification, a WiGig transceiver, and/or a HomePlug transceiver described a specification from the HomePlug Alliance.

Processor 620, which is coupled to transceiver 610 and memory 630, may be any one or more suitable processors capable of executing scripts or instructions of one or more software programs stored in wireless device 600 (e.g., within memory 630). For purposes of discussion herein, processor 620 is shown as coupled between transceiver 610 and memory 630. For actual embodiments, transceiver 610, processor 620, and/or memory 630 may be connected together using one or more buses (not shown for simplicity).

Memory 630 may include a profile table 631 that may store location data, configuration information, data rates, MAC addresses, and other suitable information of a number of wireless devices. The profile table 631 may also store information regarding the class of Bluetooth devices included within and/or associated with wireless device 600, transmit power levels for WLAN signals and/or transmit power levels for Bluetooth signals. Memory 630 may also include a non-transitory computer-readable storage medium (e.g., one or more nonvolatile memory elements, such as EPROM, EEPROM, Flash memory, a hard drive, and so on) that may store the following software (SW) modules:

an operating mode determination software module 632 to determine an operating mode of the wireless device 600 (e.g., a Wi-Fi transmit mode, one or more Bluetooth power modes, or a WLAN/BT receive mode), for example, as described below for one or more operations of FIG. 7 and/or FIG. 8;

a load impedance selection software module 634 to select one of a number of different load impedances that the tunable load circuit 440 is to provide based, at least in part, on the determined operating mode, for example, as described below for one or more operations of FIG. 7 and/or FIG. 8; and a supply voltage selection software module 636 to select one of a number of different supply voltages (or no supply voltage) to be provided to BT PA 310 by the switchable power supply 430, for example, as described below for one or more operations of FIG. 7 and/or FIG. 8.

Each software module includes instructions that, when executed by processor 620, cause wireless device 600 to perform the corresponding functions. The non-transitory computer-readable medium of memory 630 thus includes instructions for performing all or a portion of the operations of the method of FIG. 7 and/or the method of FIG. 8.

Processor 620 may execute the operating mode determination software module 632 to determine an operating mode of the wireless device 600 (e.g., a Wi-Fi transmit mode, one or more Bluetooth power modes, or a WLAN/BT receive mode). Processor 620 may also execute the load impedance selection software module 634 to select one of a number of different load impedances that the tunable load circuit 440 is to provide based, at least in part, on the determined operating mode. Processor 620 may also execute the supply voltage selection software module 636 to select one of a number of different supply voltages (or no supply voltage) to be provided to BT PA 310 by the switchable power supply 430.

Figure 7:
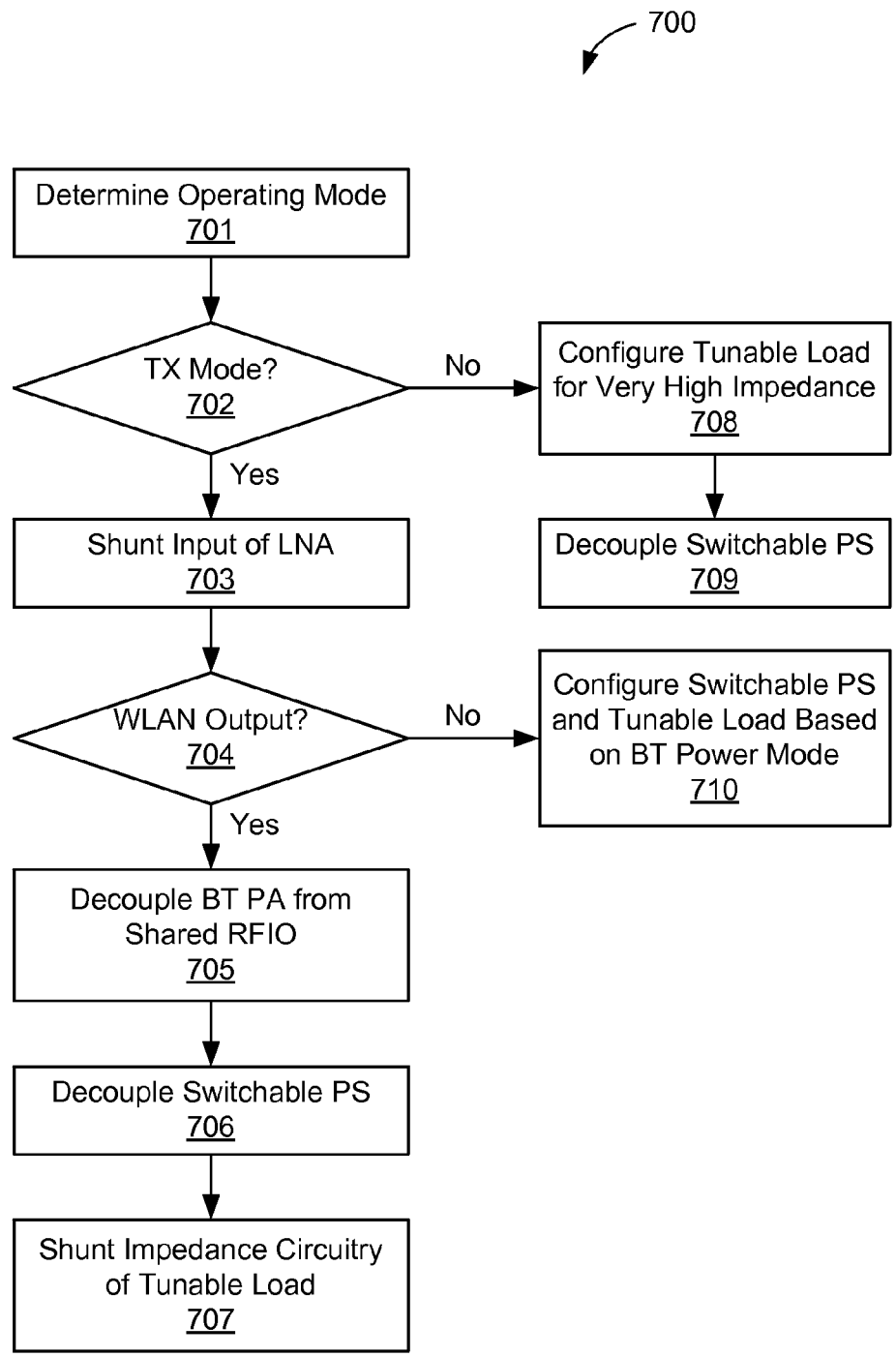
FIG. 7 is an illustrative flow chart depicting a dynamic impedance matching operation in accordance with example embodiments.

FIG. 7 is an illustrative flow chart depicting a dynamic impedance matching operation 700 in accordance with example embodiments. The dynamic impedance matching operation 700 is described below with respect to the wireless device 110 and the AFE circuit 400 of FIG. 4A (although the dynamic impedance matching operation 700 may also be performed by the AFE circuit 401 of FIG. 4B and/or the AFE circuit 403 of FIG. 4C). First, an operating mode of the AFE circuit 400 is determined (701). As described above, the operating modes for AFE circuit 400 may include a receive mode and a number of transmit modes. During the receive mode, the AFE circuit 400 may receive Bluetooth signals and/or WLAN signals from antenna 351 via RFIO circuit 350. The transmit mode may include a Wi-Fi transmit mode, a Bluetooth high power mode, a Bluetooth low power mode, and a Bluetooth ultra-low power mode.

If the AFE circuit 400 is operating in one of the transmit modes, as tested at 702, then the input terminal of LNA 490 is shunted to ground potential (703). Shunting the input terminal of LNA 490, which may be accomplished by turning on transistor MN4 via assertion of the TX_EN signal, may prevent the LNA 490 from sampling WLAN or Bluetooth signals being transmitted from AFE circuit 400. Then, a determination is made whether WLAN signals or Bluetooth signals are being transmitted (704).

If WLAN signals are being transmitted, as tested at 704, then the BT PA 310 is de-coupled from the RFIO circuit 350 (and thereby isolated from the output terminal of the WLAN PA 320 (705). This may protect the transistors which form the BT PA 310 from being damaged by the relatively high transmit power levels of the WLAN signals output from the WLAN PA 320 (e.g., as compared with the lower transmit power levels of the BT signals). The switchable power supply 430 is also de-coupled from AFE circuit 400, for example, to isolate the BT PA 310 from the supply voltages associated with and/or provided by the switchable power supply 430 (706). Next, the impedance circuitry of the tunable load circuit 440 is shunted to ground potential, for example, to provide a minimum non-zero load impedance at the output terminal of the WLAN PA 320 (707).

Conversely, if Bluetooth signals are being transmitted, as tested at 704, then the switchable power supply 430 is dynamically configured and/or adjusted to provide a load impedance value based on the Bluetooth power mode (710). For one example, when AFE circuit 400 is to operate in the Bluetooth high power mode, the switchable power supply 430 may select a supply voltage of 3.3V for the BT PA 310, and the tunable load circuit 440 may be configured to provide a first (e.g., relatively low) load impedance, for example, to maximize the power transmission efficiency of the BT PA 310. For at least one embodiment, the first load impedance may be approximately 50Ω.

For another example, when AFE circuit 400 is to operate in the Bluetooth low power mode, the switchable power supply 430 may select a supply voltage of 1.3V for the BT PA 310, and the tunable load circuit 440 may be configured to provide a second (e.g., relatively "medium") load impedance, for example, to maximize the power transmission efficiency of the BT PA 310. For at least one embodiment, the second load impedance may be approximately 80Ω.

For another example, when AFE circuit 400 is to operate in a Bluetooth ultra-low power mode, the switchable power supply 430 may select a supply voltage of 1.3V for the BT PA 310, and the tunable load circuit 440 may be configured to provide a third (e.g., relatively high) load impedance, for example, to maximize the power transmission efficiency of the BT PA 310. For at least one embodiment, the third load impedance may be approximately 100Ω.

If the AFE circuit 400 is operating in a receive mode, as tested at 702, then the tunable load circuit 440 may be dynamically configured and/or adjusted to provide a very high load impedance (e.g., a load impedance greater than the first, second, and third load impedances), for example, to prevent the received signals from damaging components of the BT PA 310 (708). Then, the switchable power supply 430 may be de-coupled from AFE circuit 400, for example, to prevent received WLAN and/or Bluetooth signals from coupling into (and possibly damaging) the BT PA 310 (709).

Figure 8:
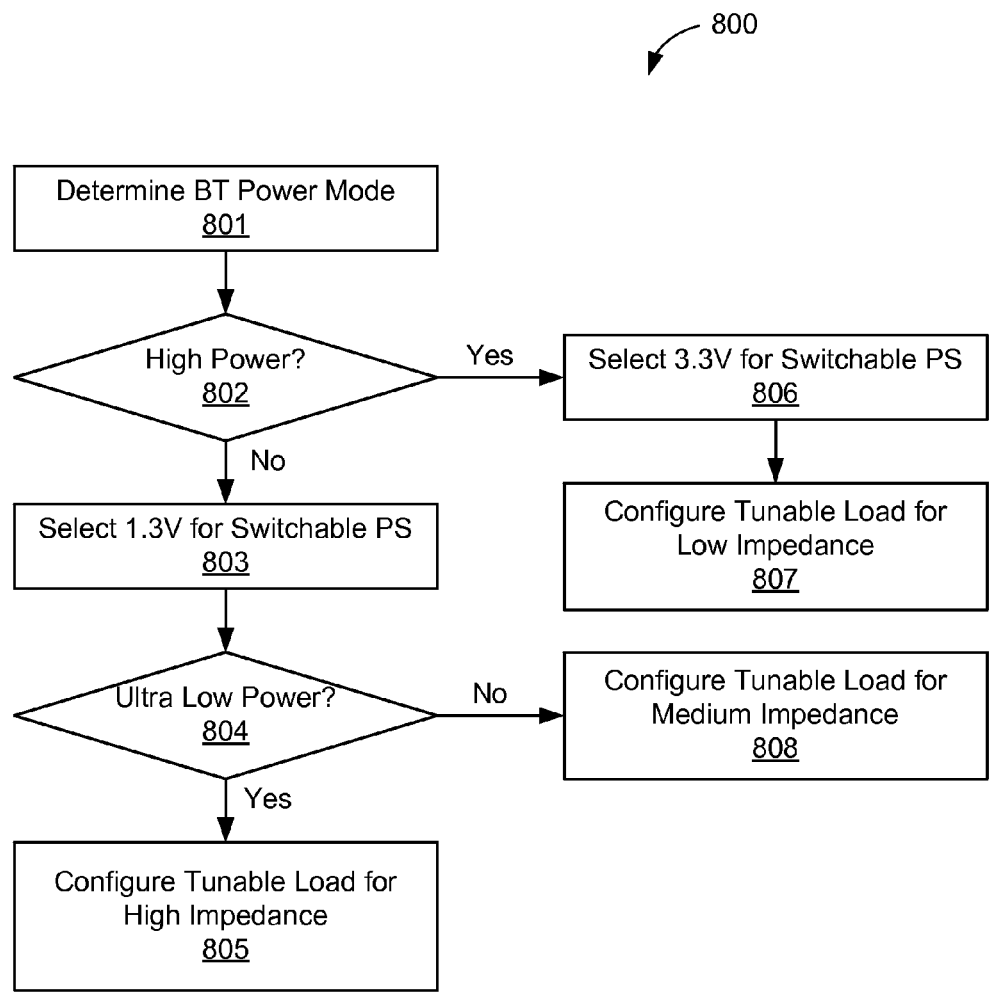
FIG. 8 is an illustrative flow chart depicting another dynamic impedance matching operation in accordance with example embodiments.

FIG. 8 is an illustrative flow chart depicting another dynamic impedance matching operation 800 in accordance with example embodiments. The dynamic impedance matching operation 800 is described below with respect to the wireless device 110 and the AFE circuit 400 of FIG. 4A (although the dynamic impedance matching operation 800 may also be performed by the AFE circuit 401 of FIG. 4B and/or the AFE circuit 403 of FIG. 4C). First, a Bluetooth operating mode of the AFE circuit 400 is determined (801). As described above, the Bluetooth operating modes for AFE circuit 400 may include a Bluetooth high power mode, a Bluetooth low power mode, and a Bluetooth ultra-low power mode.

If the AFE circuit 400 is operating in one of the Bluetooth low power modes (e.g., a Class 1.5 Bluetooth device), as tested at 802, then the switchable power supply 430 may select a supply voltage of approximately 1.3V to provide to the BT PA 310 (803). If the operating mode is a Bluetooth ultra-low power mode, as tested at 804, then the tunable load circuit 440 is dynamically configured and/or adjusted to provide the third load impedance (e.g., a relatively high load impedance) (805). Conversely, if the operating mode is a Bluetooth low power mode, as tested at 804, then the tunable load circuit 440 is dynamically configured and/or adjusted to provide the second load impedance (e.g., a relatively medium load impedance) (808).

If the operating mode is a Bluetooth high power mode (e.g., a Class 2 Bluetooth device), as tested at 802, then the switchable power supply 430 may select a supply voltage of approximately 3.3V to provide to the BT PA 310 (806). Then, the tunable load circuit 440 is dynamically configured and/or adjusted to provide the first load impedance (e.g., a relatively low load impedance) (807).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium.

In the foregoing specification, the example embodiments have been described with reference to specific example embodiments thereof. It will, however, be evident that various modifications and changes may be made thereto without departing from the broader scope of the disclosure as set forth herein. The specification and drawings are, accordingly, to be regarded in an illustrative sense rather than a restrictive sense.

What is claimed is:

1. A transceiver configured to transmit data in a plurality of operating modes including a Wi-Fi mode and two or more different Bluetooth power modes, the transceiver comprising:
   a first amplifier configured to amplify Bluetooth signals;
   a second amplifier configured to amplify Wi-Fi signals;
   an antenna coupled to the second amplifier; and
   a tunable load circuit, coupled between the first amplifier and the second amplifier, configured to provide a different load impedance for each of the plurality of operating modes, the tunable load circuit including:
      two impedance paths coupled in parallel between output terminals of the first and second amplifiers, the two impedance paths comprising (i) a first impedance path including a first capacitor, one or more first transistors, and a second capacitor coupled in series between the output terminals of the first and second amplifiers, and (ii) a second impedance path including a third capacitor and a fourth capacitor coupled in series between the output terminals of the first and second amplifiers; and
   a number of shunt paths coupled between the tunable load circuit and ground potential, the number of shunt paths comprising (i) a first shunt path including a second transistor coupled between ground potential and a common node of the third and fourth capacitors, and (ii) a second shunt path including a third transistor and a fifth capacitor coupled in series between ground potential and the common node.

2. The transceiver of claim 1, wherein the two or more different Bluetooth power modes include a Bluetooth high power mode, a Bluetooth low power mode, and a Bluetooth ultra-low power mode.

3. The transceiver of claim 2, wherein the tunable load circuit is configured to provide a first load impedance during the Bluetooth high power mode, to provide a second load impedance during the Bluetooth low power mode, and to provide a third load impedance during the Bluetooth ultra-low power mode.

4. The transceiver of claim 3, wherein the tunable load circuit is further configured to provide a fourth load impedance during the Wi-Fi mode, wherein the first load impedance is less than the second load impedance, the second load impedance is less than the third load impedance, and the fourth load impedance is less than the first, second, and third load impedances.

5. The transceiver of claim 2, further comprising:
   a switchable power supply selectively coupled to the first amplifier, the switchable power supply configured to provide a first supply voltage to the first amplifier during the Bluetooth high power mode, and configured to provide a second supply voltage to the first amplifier during the Bluetooth low power mode and the Bluetooth ultra-low power mode, the second supply voltage less than the first supply voltage.

6. The transceiver of claim 1, wherein:
   the one or more first transistors each include a gate to receive a first mode control signal;
   the second transistor includes a gate to receive a second mode control signal; and
   the third transistor includes a gate to receive a third mode control signal.

7. The transceiver of claim 6, wherein the transceiver is configured to wirelessly transmit either the amplified Bluetooth signals via the antenna or the amplified Wi-Fi signals via the antenna based at least in part on the mode control signals.

8. The transceiver of claim 1, further comprising:
   a low noise amplifier (LNA) including an input terminal coupled to the output terminal of the second amplifier; and
   a shunt transistor coupled between the input terminal of the LNA and ground potential, the shunt transistor including a gate to receive a transmission enable signal.

9. A method for operating a transceiver to transmit data in a plurality of operating modes including a Wi-Fi mode and two or more different Bluetooth power modes, the method comprising:
   amplifying Bluetooth signals for wireless transmission, using a first amplifier, during the two or more different Bluetooth power modes;
   amplifying Wi-Fi signals for wireless transmission, using a second amplifier, during the Wi-Fi mode; and
   providing a different load impedance for each of the plurality of operating modes using a tunable load circuit including first and second parallel impedance paths and a number of shunt paths coupled to ground potential, wherein:
      the first and second parallel impedance paths comprise (i) a first impedance path including a first capacitor, one or more first transistors, and a second capacitor coupled in series between output terminals of the first and second amplifiers, and (ii) a second impedance path including a third capacitor and a fourth capacitor coupled in series between the output terminals of the first and second amplifiers; and
      the number of shunt paths comprise (i) a first shunt path including a second transistor coupled between ground potential and a common node of the third and fourth capacitors, and (ii) a second shunt path including a third transistor and a fifth capacitor coupled in series between ground potential and the common node.

10. The method of claim 9, wherein the two or more different Bluetooth power modes include a Bluetooth high power mode, a Bluetooth low power mode, and a Bluetooth ultra-low power mode.

11. The method of claim 10, wherein the providing comprises:

selecting a first load impedance during the Bluetooth high power mode;
selecting a second load impedance during the Bluetooth low power mode; and
selecting a third load impedance during the Bluetooth ultra-low power mode.

12. The method of claim 11, wherein the providing further comprises:
selecting a fourth load impedance during the Wi-Fi mode.

13. The method of claim 10, further comprising:
providing a first supply voltage to the first amplifier during the Bluetooth high power mode; and
providing a second supply voltage to the first amplifier during the Bluetooth low power mode and the Bluetooth ultra-low power mode, the second supply voltage less than the first supply voltage.

14. The method of claim 9, further comprising:
receiving, using a low noise amplifier (LNA), Bluetooth and Wi-Fi signals during a receive mode; and
shunting an input terminal of the LNA to ground potential during wireless transmission of the Bluetooth signals and the Wi-Fi signals.

15. A transceiver configured to transmit data in a plurality of operating modes including a Wi-Fi mode and two or more different Bluetooth power modes, the transceiver comprising:
means for amplifying Bluetooth signals, using a first amplifier, for wireless transmission during the two or more different Bluetooth power modes;
means for amplifying Wi-Fi signals, using a second amplifier, for wireless transmission during the Wi-Fi mode; and
means for providing a different load impedance for each of the plurality of operating modes using a tunable load circuit including first and second parallel impedance paths and a number of shunt paths coupled to ground potential, wherein:
the first and second parallel impedance paths comprise (i) a first impedance path including a first capacitor, one or more first transistors, and a second capacitor coupled in series between output terminals of the first and second amplifiers, and (ii) a second impedance path including a third capacitor and a fourth capacitor coupled in series between the output terminals of the first and second amplifiers; and
the number of shunt paths comprise (i) a first shunt path including a second transistor coupled between ground potential and a common node of the third and fourth capacitors, and (ii) a second shunt path including a third transistor and a fifth capacitor coupled in series between ground potential and the common node.

16. The transceiver of claim 15, wherein the two or more different Bluetooth power modes include a Bluetooth high power mode, a Bluetooth low power mode, and a Bluetooth ultra-low power mode.

17. The transceiver of claim 16, wherein the means for providing is to:
select a first load impedance during the Bluetooth high power mode;
select a second load impedance during the Bluetooth low power mode; and
select a third load impedance during the Bluetooth ultra-low power mode.

18. The transceiver of claim 17, wherein the means for providing is to further:
select a fourth load impedance during the Wi-Fi mode.

19. The transceiver of claim 16, further comprising:
means for providing a first supply voltage to the means for amplifying Bluetooth signals during the Bluetooth high power mode; and
means for providing a second supply voltage to the means for amplifying Bluetooth signals during the Bluetooth low power mode and the Bluetooth ultra-low power mode, the second supply voltage less than the first supply voltage.

20. The transceiver of claim 15, further comprising:
means for receiving, using a low noise amplifier (LNA), Bluetooth and Wi-Fi signals during a receive mode; and
means for shunting an input terminal of the LNA to ground potential during wireless transmission of the Bluetooth signals and the Wi-Fi signals.

21. A transceiver configured to transmit data in a plurality of operating modes, the transceiver comprising:
a first amplifier configured to amplify first data signals;
a second amplifier configured to amplify second data signals;
an antenna coupled to the second amplifier; and
a tunable load circuit, coupled between output terminals of the first and second amplifiers, configured to provide a different load impedance for each of the plurality of operating modes, the tunable load circuit comprising:
a first impedance path including a first capacitor, one or more first transistors, and a second capacitor coupled in series between the output terminals of the first and second amplifiers;
a second impedance path including a third capacitor and a fourth capacitor coupled in series between the output terminals of the first and second amplifiers;
a first shunt path including a second transistor coupled between ground potential and a common node of the third and fourth capacitors; and
a second shunt path including a third transistor and a fifth capacitor coupled in series between ground potential and the common node.

22. The transceiver of claim 21, wherein the plurality of operating modes includes a Wi-Fi mode, a Bluetooth high power mode, a Bluetooth low power mode, and a Bluetooth ultra-low power mode.

23. The transceiver of claim 22, wherein the tunable load circuit is configured to provide a first load impedance during the Bluetooth high power mode, to provide a second load impedance during the Bluetooth low power mode, to provide a third load impedance during the Bluetooth ultra-low power mode, and to provide a fourth load impedance during the Wi-Fi mode.

24. The transceiver of claim 22, further comprising:
a switchable power supply selectively coupled to the first amplifier, the switchable power supply configured to provide a first supply voltage to the first amplifier during the Bluetooth high power mode, and configured to provide a second supply voltage to the first amplifier during the Bluetooth low power mode and the Bluetooth ultra-low power mode, the second supply voltage less than the first supply voltage.

25. The transceiver of claim 21, wherein:
the one or more first transistors each include a gate to receive a first mode control signal;
the second transistor includes a gate to receive a second mode control signal; and
the third transistor includes a gate to receive a third mode control signal.

26. The transceiver of claim 21, further comprising:
- a low noise amplifier (LNA) including an input terminal coupled to the output terminal of the second amplifier; and
- a shunt transistor coupled between the input terminal of the LNA and ground potential, the shunt transistor including a gate to receive a transmission enable signal.

* * * * *